United States Patent [19]

Kimura et al.

[11] Patent Number: 5,658,811
[45] Date of Patent: Aug. 19, 1997

[54] METHOD OF MANUFACTURING A SEMICONDUCTOR DEVICE

[75] Inventors: Shinichiro Kimura, Kunitachi; Hiromasa Noda, Tokyo; Nobuyoshi Kobayashi, Kawagoe; Yasushi Goto, Kodaira; Tokuo Kure, Tokyo, all of Japan

[73] Assignee: Hitachi, Ltd., Tokyo, Japan

[21] Appl. No.: 405,836

[22] Filed: Mar. 17, 1995

[30] Foreign Application Priority Data

Mar. 24, 1994 [JP] Japan .................. 6-053400

[51] Int. Cl.⁶ .................................... H01L 21/265
[52] U.S. Cl. .................... 438/289; 438/291; 438/298
[58] Field of Search ........................ 437/26, 28, 29, 437/34, 40, 41, 44, 48, 57, 192, 203, 43, 45; 148/DIG. 82

[56] References Cited

U.S. PATENT DOCUMENTS

| | | | |
|---|---|---|---|
| 4,902,645 | 2/1990 | Ohba | 437/192 |
| 5,073,512 | 12/1991 | Yoshino | 437/45 |
| 5,175,119 | 12/1992 | Matsutami | 437/44 |
| 5,194,926 | 3/1993 | Hayden | 437/26 |
| 5,399,508 | 3/1995 | Nowak | 437/45 |
| 5,413,949 | 5/1995 | Hong | 437/45 |
| 5,444,008 | 8/1995 | Han et al. | 437/45 |
| 5,464,782 | 11/1995 | Koh | 437/45 |
| 5,571,738 | 11/1996 | Krivokapic | 437/67 |

*Primary Examiner*—Tuan H. Nguyen
*Attorney, Agent, or Firm*—Antonelli, Terry, Stout & Kraus, LLP

[57] ABSTRACT

A method of manufacturing a semiconductor device is disclosed. After an insulating film having an opening is formed on a first thin tungsten film, an impurity is introduced into the substrate through the opening to form a punch-through stopper between a source and a drain. Then, on the first tungsten film inside the opening, a second tungsten film is selectively deposited to form a gate electrode. With this method, it is possible to easily fabricate high-speed MOSFETs whose channel length is less than half a micron.

31 Claims, 17 Drawing Sheets

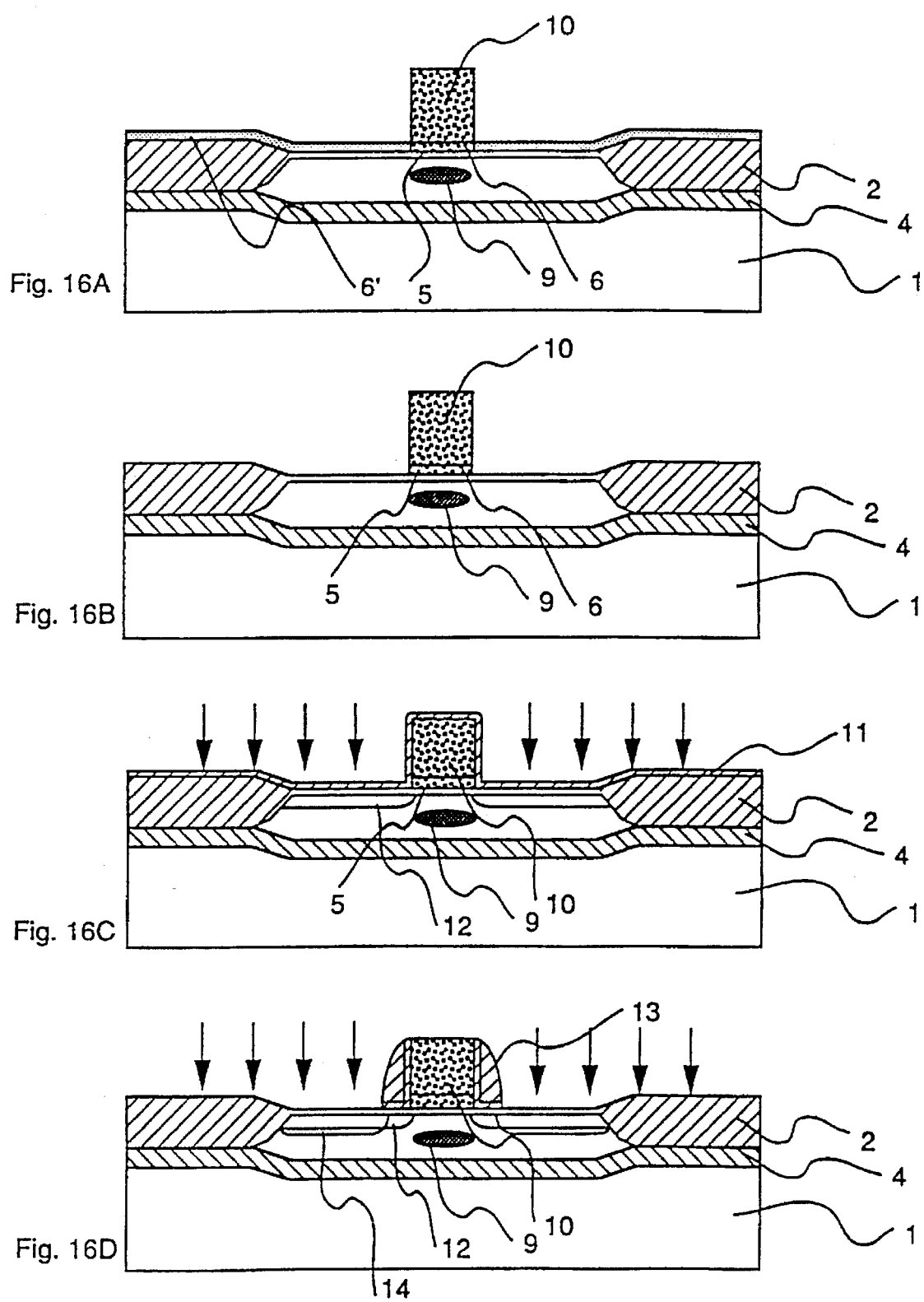

5,658,811

METHOD OF MANUFACTURING A SEMICONDUCTOR DEVICE

BACKGROUND OF THE INVENTION

The present invention relates to a method of manufacturing semiconductor devices and more specifically to a method of manufacturing a high-performance metal oxide semiconductor field-effect transistor (MOSFET) with small resistance of gate electrode and PN junction capacitance.

Dynamic random access memories (DRAMs), a typical example of semiconductor integrated circuit device using silicon, are currently mass-produced as 4-Mbit products using the 0.8 micron manufacturing technology. 16-Mbit products have also started to be mass-produced using the next-generation 0.5 micron manufacturing technology. With advances of micro-fabrication technologies, the semiconductor devices tend to become smaller and smaller in size.

In the MOSFETs with channel length of less than half-micron, however, the velocity of electrons or holes flowing through a channel region are near a saturation speed. Hence, a further reduction in the channel length is not expected to result in a current becoming large in reverse proportion to the channel length.

Another drawback is that as the micro-fabrication advances, the impurity concentration in the substrate increases. As a result of high electric field caused by the impurity concentration, mobility of electrons and holes becomes lower because of the scattering at Si(a substrate)/SiO2(a gate oxide formed on the substrate) interface. This is another factor that reduces the merit of increased current realized by micro-fabrication.

Further, an increase in impurity concentration in the substrate leads to an increase in the PN junction capacitance because the width of the depletion layer is narrowed. The finer gate electrode causes an increase in the gate resistance. These combine to prevent performance improvement that would otherwise be realized by the micro-fabrication of MOSFET. These are explained in more detail by referring to FIG. 4.

Reference numeral 1 represents a semiconductor substrate; 2 a device isolation oxide film; 100, 100' polysilicon gate electrodes; 11 a silicon dioxide film; 12, 12' lightly doped impurity layers; 13, 13' sidewall insulation films; 14, 14' highly doped impurity layers; 15, 15' silicide, films; 16 an interlayer insulation film; 17 a metal plug; 18 a metal interconnect; 21, 22 lightly doped impurity layers; 41, 42 impurity layers; and 91, 92 punch-through stoppers.

FIG. 4 shows a cross section of a semiconductor device. Here, let us take an example of a complementary MOS (CMOS) in which MOSFETs with different conductivity types exist on the same substrate.

A characteristic configuration of MOSFETs with the channel length of less than half-micron includes punch-through stoppers 91, 92 to prevent a punch-through between source and drain, silicide films 15, 15' to reduce resistance of electrodes, and polysilicon gate electrodes 100, 100' with different conductivity types.

When the lightly doped impurity layer 21 has a p-type conductivity, the punch-through stopper 92 has the same p-type conductivity as the lightly doped impurity layer 21 and has a higher impurity concentration. The punch-through stopper 91 and the lightly doped impurity layer 22 are of n type and the impurity concentration of the punch-through stopper 91 is higher than that of the lightly doped impurity layer 22.

The punch-through stopper 91 prevents the depletion layer in the lightly doped impurity layer 22 at the PN junction between the source(or the drain) of the first MOSFET (highly doped impurity layer 14) and the lightly doped impurity layer 22 from protruding into the channel region (so-called short channel effect). This lowers the leakage current between the source and the drain of the first MOSFET. The punch-through stopper 92 prevents the depletion layer in the lightly doped impurity layer 21 at the PN junction between the source (or the drain) of the second MOSFET (highly doped impurity layer 14') and the lightly doped impurity layer 21 from protruding into the channel region. This lowers the leakage current between the source and drain in the second MOSFET.

The silicide films 15, 15' on the highly doped impurity layers 14, 14' and the polysilicon gate electrodes 100, 100' have a function of reducing the resistance of these conductive layers. The above-mentioned highly doped impurity layer becomes thin as the MOSFET becomes fine and its resistance increases to that extent if it has the same impurity concentration. So far the resistance of the highly doped impurity layer is sufficiently small when compared with the channel resistance and thus does not directly affect the current of the MOSFET. Although the channel resistance decreases with the reduction in the channel length, the resistance of the highly doped impurity layer increases to become equal to that of the channel resistance. As a result, the voltage drop in the highly doped impurity layer is seen remarkable, making it impossible to derive the expected performance of the MOSFET. As a means to prevent this and to reduce the resistance, a silicide film may be used. By using salicide (self-aligned silicide) technology, the silicide film can be formed on both the polysilicon gate electrodes 100, 100' and the highly doped impurity layers 12, 12' (source and drain).

The first MOSFET and the second MOSFET have gate electrodes of different conductivity types. The reason that different conductivity types are used is to make both the N-channel MOSFET (second MOSFET) and the P-channel MOSFET a surface channel type. The P-channel MOSFET, like the N-channel MOSFET, has so far used a polysilicon containing a high concentration of n-type impurity for the gate electrode. In the P-channel MOSFET, however, because its work function difference from that of the substrate is small, the gate voltage (threshold voltage) to turn on the MOSFET becomes high. Thus, the channel region is doped with an impurity (boron) of a conduction type different from that of the substrate to make areas close to the surface a P type and thereby to adjust the threshold voltage. In such an impurity distribution, holes flow inside the substrate. Thus, such an MOSFET is called a buried channel type.

Because the buried channel type MOSFET has its channel region apart from the interface between the substrate and a gate oxide film formed under the gate electrode, the holes are hardly distracted by the gate oxide film surface and the mobility of the holes therefore is little lowered. The separation of the channel region from the interface, however, makes more likely an interference with the depletion layer between the source and the drain, resulting in a leakage current. This problem can be solved by forming the gate electrode of the P-channel MOSFET With a P-channel polysilicon film to make the P-channel MOSFET as the surface channel type, as in the N-channel MOSFET.

A variety of improvements have been made in this way for realizing finer fabrication of MOSFETs and for higher performances. The measures taken for improvements that were mentioned above have also drawbacks of preventing performance improvement and rendering the manufacturing process more difficult.

For example, the punch-through stoppers 91, 92 to limit the leakage current caused by the short channel effect increase the concentration of impurity in the channel region, and therefore reduce the mobility of electrons and holes, which in turn leads to reduction in the channel current. Further, because the depletion layer is thin, the PN junction capacitance increases prolonging the signal delay time. This problem has been dealt with so far by reducing the size and increasing the channel current. When the channel length is in the order of half-micron, however, the velocity of electrons and holes becomes saturated and a further reduction in the channel length does not necessarily result in an increased channel current. It is found therefore that the reduction in the channel length alone cannot cope with the reduction in the mobility and the increase in the junction capacitance and that the performance of the MOSFETs and the CMOSs using such MOSFETs deteriorate.

If the polysilicon gate electrodes 100, 100' are used in which silicide is grown near the surface, the resistance also increases as the device size is reduced. This is because as the size of the gate electrode decreases, the reaction between polysilicon and metal becomes uneven. Even with the highly doped impurity layer (source and drain) with a far larger area than the gate electrode, there is also a limit in another sense to siliciding. This is because as the highly doped impurity layer becomes thin, it is impossible to form a sufficiently thick silicide layer. Further, because the silicide films 15, 15' are formed inside the semiconductor substrate, regions containing impurities at high concentrations are silicided. Hence, the remaining junction regions become relatively low concentration areas, which are not preferable for reducing the resistance of the highly doped impurity layer.

In addition to reducing resistance, CMOSs have requirements that polysilicons of different conductivity types be used as practically as possible for gate electrodes. This brings an increase in the number of steps in the gate electrode forming process, causing problems of an increased LSI cost and a lowered yield.

SUMMARY OF THE INVENTION

An object of this invention is to provide a method of easily manufacturing high-performance MOSFETs with channel lengths less than half a micron.

Another object of this invention is to provide a method of manufacturing high-performance micro-fine CMOSs easily.

A further object of this invention is to provide a method of easily manufacturing electrodes suited for micro-fine semiconductor devices.

The above objectives can be realized by a semiconductor device manufacturing method, which comprises the steps of:

forming a device isolation oxide film around a first region of a semiconductor substrate having a first conductivity type;

forming a gate insulating film in the first region;

forming a first tungsten film on the semiconductor substrate having the gate insulating film;

forming a third insulating film having an opening at a specified area in the first region on the first tungsten film;

forming a punch-through stopper of a first conductivity type by introducing a first impurity into the semiconductor substrate through the opening in the third insulating film;

selectively depositing a second tungsten film thicker than the first tungsten film in the opening of the third insulating film;

removing the third insulating film;

removing an exposed part of the first tungsten film;

forming a fourth insulating film on sidewalls of the layered first and second tungsten films; and introducing a second impurity into the semiconductor substrate to form a source and a drain of a second conductivity type opposite to the first conductivity type.

This is further described by referring to FIG. 1. FIG. 1 shows a cross section of a semiconductor device of this invention. The punch-through stopper 9 is formed only directly below the gate electrode 10 by a self-aligned process described later in such a way as to be in contact with the source and drain in only small areas. The gate electrode uses a tungsten film rather than a layered film of a polysilicon film and a silicide film. In FIG. 1, the gate electrode consists of three tungsten film layers 6, 10, 15. The first layer 6 of the gate electrode 10 in contact with the gate insulating film 5 is a tungsten film deposited by sputtering which ensures excellent adhesivity with the insulating film; the second layer is a tungsten film 10 selectively grown on the surface of the tungsten film 6; and the third layer is a tungsten film 15 grown on the second tungsten film 10 at the same time that the tungsten film is grown on the surface of the highly doped impurity layer 14.

In FIG. 1, reference numeral 1 is a semiconductor substrate; 2 a device isolation insulating film; 4 a highly doped impurity layer to improve the device isolation characteristic; 9 a punch-through stopper; 11 an insulating film; 12 a lightly doped impurity layer (a doped impurity layer is hereafter referred to simply as a doped layer); 13 a sidewall insulating film of the gate electrode; 14 a highly doped layer; 16 an interlayer insulating film; 17 a metal plug closing a contact hole; and 18 a metal interconnect.

The semiconductor device of FIG. 2 is similar in construction to the one shown in FIG. 1 but is characterized in that the width of the first-layer tungsten film 6 is wider than the second-layer tungsten film 10 and that in an area of the substrate below that part of the first-layer tungsten film 6 which protrudes from the second-layer tungsten film 10 is formed a lightly doped impurity layer 12.

A semiconductor device of FIG. 3 is an example of a CMOS using the semiconductor device shown in FIG. 1. In FIG. 3, denoted 21, 22 are well regions; 41, 42 are highly doped layers to improve the device isolation characteristics; and 91, 92 are punch-through stoppers of different conductivity types.

These and other objects and many of the attendant advantages of the invention will be readily appreciated as the same becomes better understood by reference to the following detailed description when considered in connection with the accompanying drawings.

BRIEF DESCRIPTION OF THE DRAWINGS

FIGS. 15A to 15D, FIGS. 16A to 16D and FIGS. 17A to 17C are cross sections of a semiconductor device showing the process of making it according to the fourth embodiment of this invention.

DETAILED DESCRIPTION OF THE INVENTION

Figure 1:
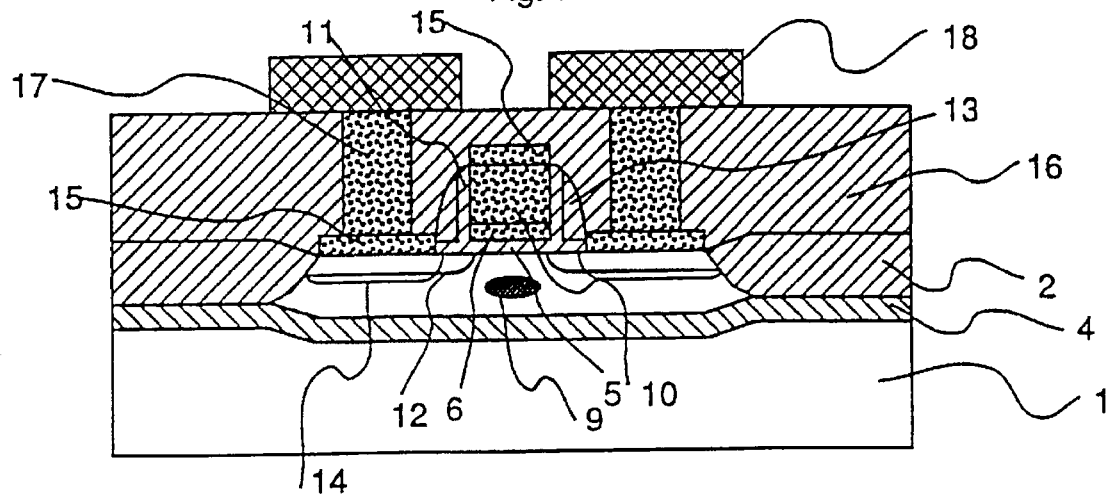
FIG. 1 is a cross section of a semiconductor device manufactured by a method of a first embodiment of this invention.
Figure 2:
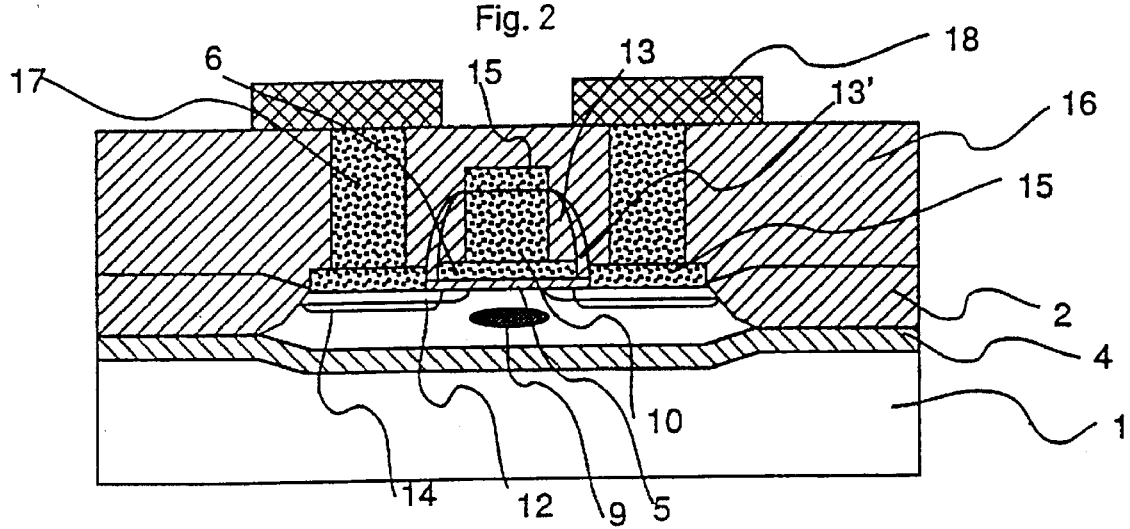
FIG. 2 is a cross section of a semiconductor device manufactured by a method of a second embodiment of this invention.
Figure 3:
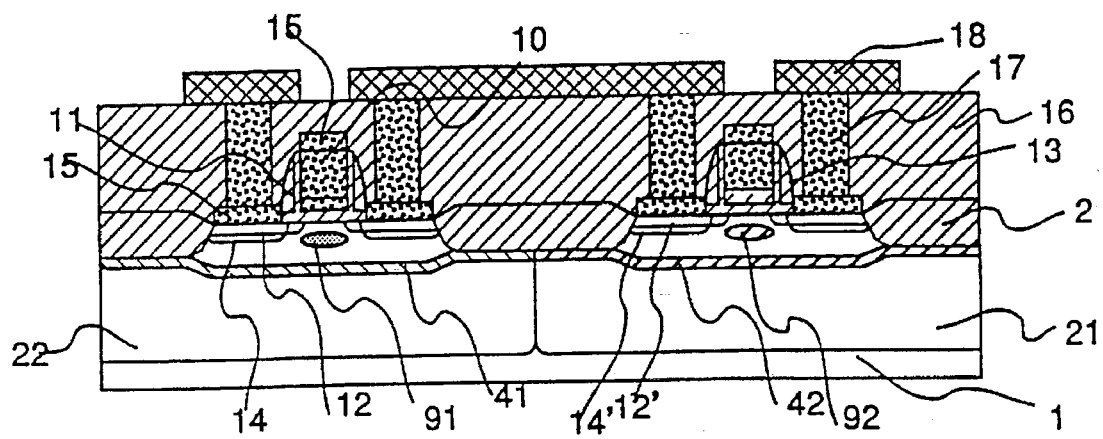
FIG. 3 is a cross section of a CMOS manufactured by a method of this invention.
Figure 4:
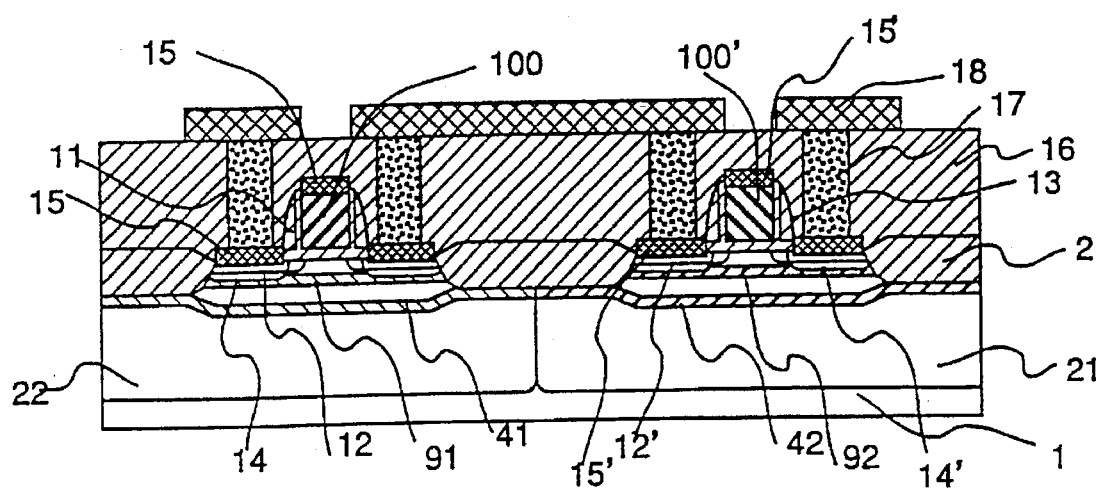
FIG. 4 is a cross section of a CMOS manufactured by another method.

By forming a punch-through stopper only directly below the channel region, it is possible to reduce its area of contact with the source and drain thereby significantly reducing the PN junction capacitance between the source and drain and the substrate (or well region). For example, in a MOSFET whose channel length is about 0.2 microns, the peak concentration of the punch-through stopper is slightly less than $10^{18}/cm^3$ and the PN junction capacitance is approximately 2 fF/$\mu m^2$. In a MOSFET structure in which a punch-through stopper is locally formed below the gate electrode as in this embodiment (localized punch-through stopper), the PN junction capacitance can be reduced to about one tenth. This in turn improves the propagation time of signals.

Local formation of a punch-through stopper is disclosed in Japan Patent Laid-Open No. 9452/1980. This previous art has different masks for making the punch-through stopper and for the gate electrode and thus requires many steps. Another disadvantage is that the necessity of mask alignment makes the finer fabrication difficult. With this invention, the punch-through stopper and the tungsten film are formed by the same mask (non-organic insulating film such as silicon dioxide film), which allows finer fabrication and requires a fewer number of steps.

Making the gate electrode with a metal, especially tungsten, results in a reduction in the resistance of the gate electrode and an increase in the operation speed. Because tungsten has an excellent heat resistance, the gate electrode after having been formed can be heat-treated at elevated temperatures. While the conventional silicided gate electrode has a sheet resistance of 10 $\Omega/\square$, the use of tungsten for the gate electrode reduces it to as low as 1 $\Omega/\square$. The use of tungsten offers another advantage of not requiring to form different conductivity types of gate electrodes, as required by the conventional art, thus reducing the number of process steps.

The use of tungsten gate electrode itself is theoretically possible with the conventional MOSFET structure. In practice, however, etching a metal like tungsten on such a thin insulating film (about 5 nm for instance) as a gate insulating film is very difficult because of selectivity ratio of etching. When a tungsten film more than 500 nm thick is actually etched, unevenness in the etch within the wafer causes the gate insulating film about 5 nm thick to be etched away so that even the substrate is etched in some regions.

In this invention, as will be detailed in embodiments, this problem is solved by reducing the thickness of the tungsten film to be etched.

A method of growing a tungsten film over the surface of the doped layer and the surface of the gate electrode does not erode the highly doped layer 14 as does the siliciding method, so that the resistance of the highly doped layer 14 can be further reduced.

As mentioned above, by locally providing a punch-through stopper beneath the gate electrode, the PN junction capacitance can be greatly reduced. Further, the use of tungsten electrode reduces the gate resistance. A tungsten film grown on the highly doped layer 14 also reduces the resistance of the doped layer. Furthermore, forming the gate electrode with tungsten simplifies the process of making the gate electrode, which in turn realizes a high-performance MOSFET with low cost, leading to improvement of performance of the LSI.

Embodiment 1

Now, by referring to FIGS. 5A to 5D, 6A to 6A, 7A to 7D and 8A to 8B, the first embodiment will be detailed. In this explanation, we take an N-channel MOSFET as an example. By reversing the conductivity type of the substrate or impurity region, the description can also apply to the P-channel MOSFETs.

Figure 5A:
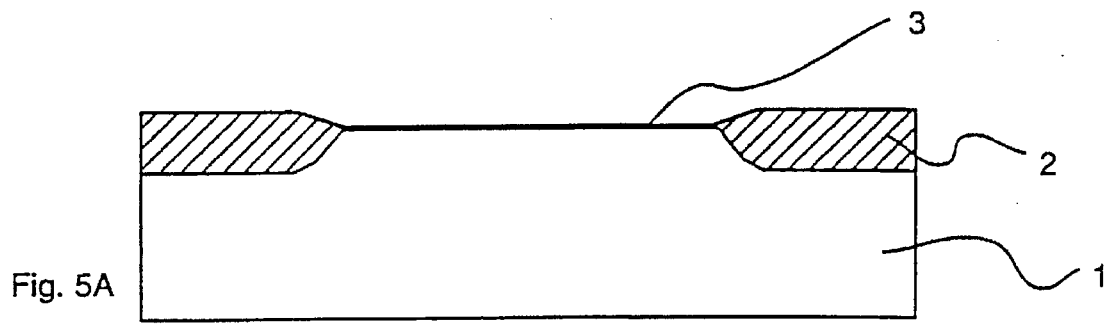
FIGS. 5A to 5D, FIGS. 6A to 6D, FIGS. 7A to 7D and FIGS. 8A to 8B are cross sections of a semiconductor device showing the process of making it according to the first embodiment of this invention.

As shown in FIG. 5A, by using a known selective oxidation, a device isolation oxide film 2 made from a silicon dioxide film is grown on the P-type silicon semiconductor substrate 1 to provide a first region where a device is to be formed. In more concrete terms, the semiconductor substrate 1 was heat-treated in the presence of oxidizing atmosphere to grow a silicon dioxide film 3 to a thickness of about 20 nm over the surface of the substrate 1. Then, a silicon nitride film (not shown) was deposited over the silicon dioxide film 3 by a known low pressure chemical vapor deposition. Then, the silicon nitride film was etched so as to remain on the first region. The semiconductor substrate 1 was oxidized for 30 minutes in an atmosphere containing water vapor at 1100° C. to grow a silicon dioxide film 2 only in a region not covered by the silicon nitride film. Then, the silicon nitride film used as a mask for oxidation was removed by a phosphoric acid solution heated at 180° C. to obtain a cross-sectional structure of FIG. 5A. The thickness of the silicon nitride film is about 100 nm and that of the grown silicon dioxide film 2 about 300 nm.

Figure 5B:
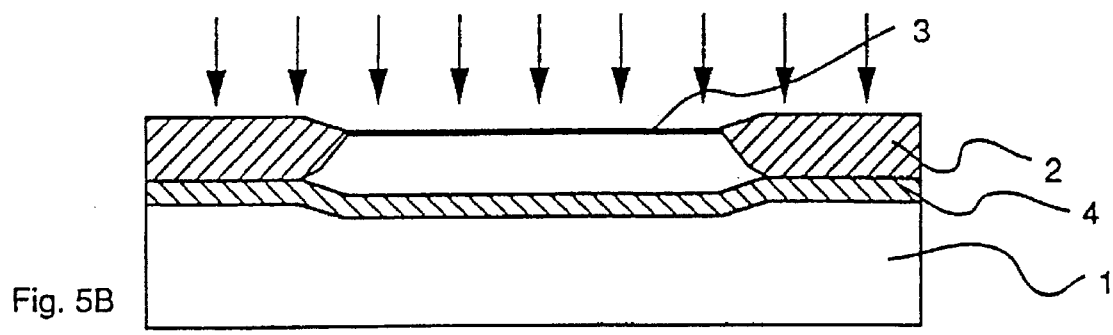

The grown silicon dioxide film 2 alone cannot provide a sufficient device isolation characteristic because a low-resistance region (channel) is formed under the silicon dioxide film 2 electrically connecting adjacent device forming regions. Hence, as shown in FIG. 5B, an impurity to form a region of the same conductivity type as the substrate is implanted over the entire semiconductor substrate by a known implantation method to form beneath the device isolation insulating film 2 a doped layer 4 that prevents the formation of a channel. In concrete terms, boron is implanted in $5 \times 10^{13}/cm^2$ at 100 KeV under conditions so set that the peak of impurity concentration will be located near the interface between the silicon dioxide film 2 and the substrate. Because there is a difference in the ion blocking capability between the oxide film 2 and the substrate, the peak position of the impurity region 4 is deeper where there is no oxide film 2. The silicon dioxide film 3 prevents contamination from entering into the interior of the substrate during ion implantation. This silicon dioxide film may be newly formed after removing the silicon dioxide film 3. When the substrate is N type and a P-channel MOSFET is to be formed, phosphorus ions are usually implanted.

Figure 5C:
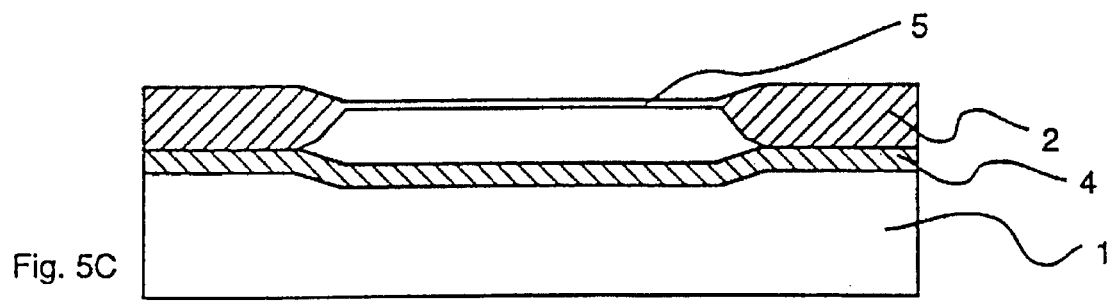

Next, after removing the silicon dioxide film 3, the gate insulating film 5 is formed as shown in FIG. 5C. Here, a silicon dioxide film is used for the gate insulating film. Before forming the gate insulating film 5, such processing as cleaning to remove surface contaminations accompanied by ion implantation and thermal treatment to activate implanted ions are performed. The gate insulating film 5 was formed by oxidizing the semiconductor substrate 1 at 800° C. The thickness of the gate insulating film 5 was about 5 nm.

Figure 5D:
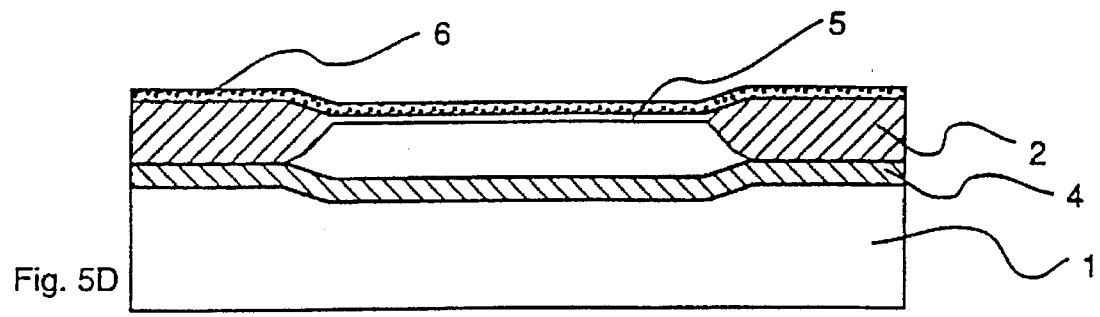

Then, as shown in FIG. 5D, a tungsten film 6 is deposited as a metal film of the bottom layer of the gate electrode by sputtering. The tungsten film 6 was made as thick as 20 nm so that, as described later, the gate insulating film 5 will not be cut during processing. Deposition of the film was done by sputtering to provide a good adhesiveness with the gate oxide film.

Figure 6A:
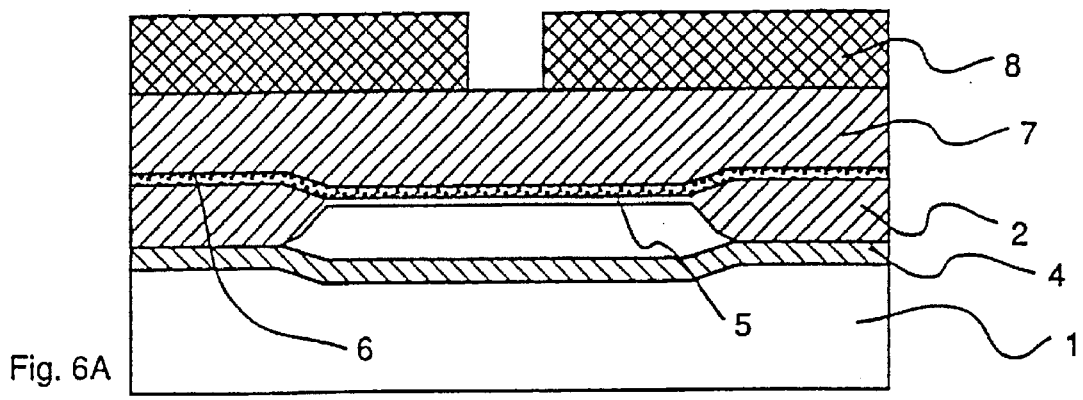

Next, as shown in FIG. 6A, a non-organic insulating film, e.g., a silicon dioxide film 7, is deposited over the tungsten film 6. Because the tungsten does not react with the silicon dioxide film, it is possible to use a oxide film forming technique performed at relatively high temperatures. This embodiment, however, used a chemical vapor deposition that accelerates the reaction with plasma to deposit a silicon dioxide film 7 to a thickness of about 200 nm. Then, on the silicon dioxide film 7, a pattern of resist film 8 is formed by using a known lithography, as shown.

Figure 6B:
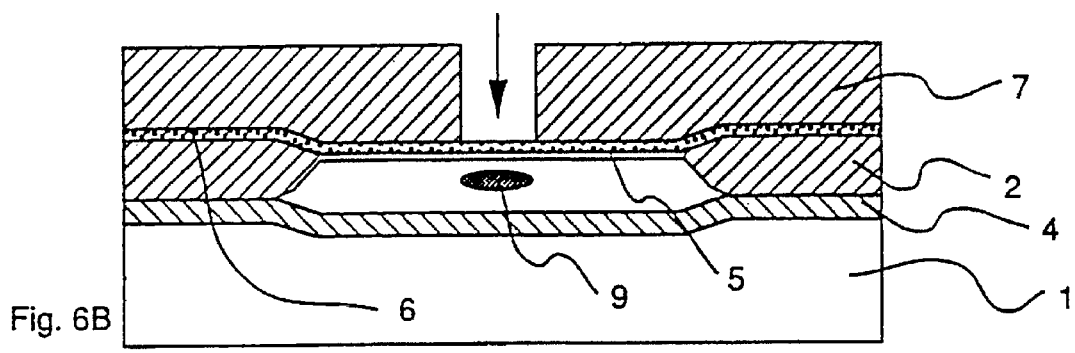

Next, as shown in FIG. 6B, the silicon dioxide film 7 is formed with an opening that reaches the underlying tungsten film 6. The forming of the opening is done by a known dry etching. The silicon dioxide film has an etch rate more than ten times faster than the tungsten film 6, so that, as shown in FIG. 6B, it is possible to stop the etching of the silicon dioxide film 7 at the surface of the tungsten film 6. Then, the resist film 8 is removed and impurity ions are implanted through this opening to form a punch-through stopper 9. In this embodiment, $1 \times 10^{13}/cm^2$ of boron was implanted with an energy of 20-30 KeV. In the case of a P-channel MOSFET, an arsenic is implanted to form the punch-through stopper.

Figure 6C:
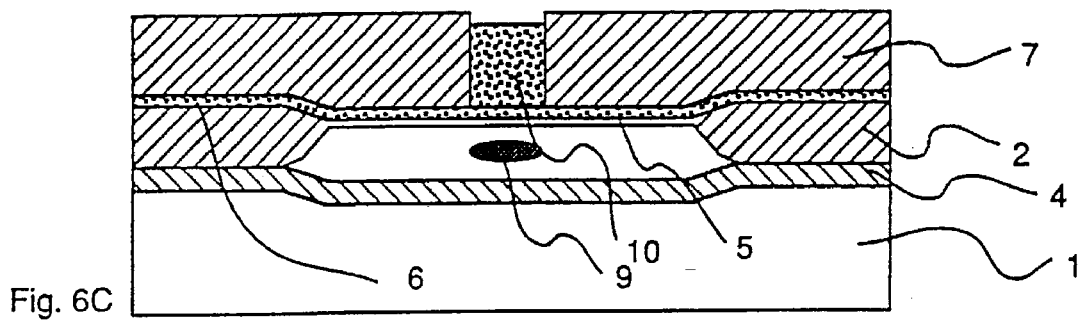

Next, by using a known technique for selective growth of tungsten, a tungsten film 10 is grown to fill the interior of the opening, with the exposed surface of the tungsten film 6 at the bottom of the opening functioning as a core as shown in FIG. 6C. The thickness of the grown tungsten film is in this embodiment 150–200 nm. In more concrete terms, a chemical vapor deposition was performed in a gas mixture of tungsten hexafluoride $WF_6$ and hydrogen $H_2$ or a gas mixture of $WF_6$ and silane $SiH_4$.

Figure 6D:
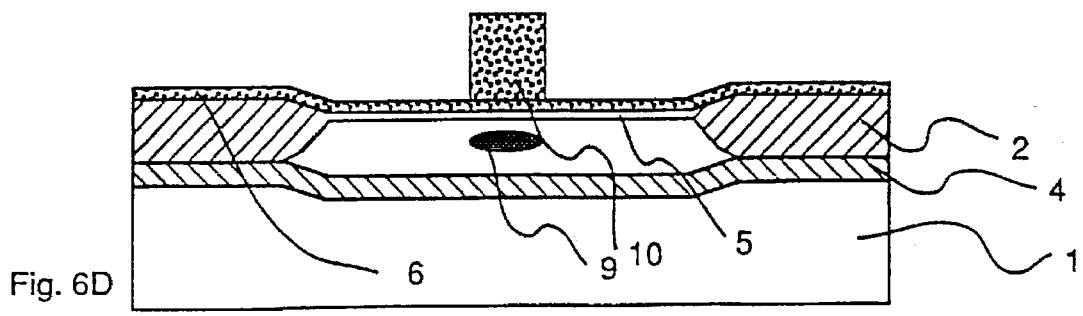

Next, as shown in FIG. 6D, the silicon dioxide film 7 in which the opening is formed is removed by a water solution of hydrofluoric acid. It is noted that tungsten does not dissolve in the hydrofluoric acid.

The tungsten film, unlike a polysilicon film, has columnar grains. Forming the gate electrode by using the conventional method therefore results in uneven side surfaces because of the grain boundaries even if the sidewalls of a resist film as a mask are smooth. Because of this, even a single gate electrode may have varying sizes. This problem becomes grave as the width of the gate electrode size decreases.

With the method of this invention, on the other hand, the growth of the tungsten film 10 in the lateral direction is limited by the sidewall of the opening. Because the silicon dioxide film is amorphous, the sidewalls can be formed smoothly. Thus, it is possible to make the sidewalls of the tungsten film 10 shown in FIG. 6D smooth.

Figure 7A:
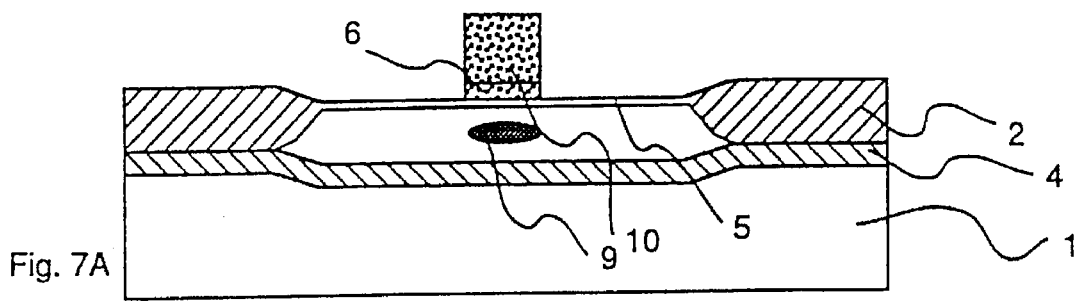

Next, as shown in FIG. 7A, the tungsten film 6 about 20 nm thick covering the surface of the semiconductor substrate 1 is removed to partially expose the device isolation insulating film 2 and the gate insulating film 5. Removal of the tungsten film is done by using a known dry etching. In that case, the thickness of the tungsten film to be removed greatly influences the partial removing of the underlying gate insulating film 5. This is because as the thickness of the film to be etched becomes larger, the over-etch time required to improve the etching uniformity becomes longer increasing the time during which the underlying oxide film is etched. In this embodiment, the tungsten film to be removed is about 20 nm thick and the etching was able to be stopped even on the 5 nm thick gate insulating film 5 while maintaining the uniformity. The effective thickness of the tungsten film 6 ranges between 0.3 nm and 50 nm but it is preferred to be in the range of 1 nm to 30 nm.

Figure 7B:
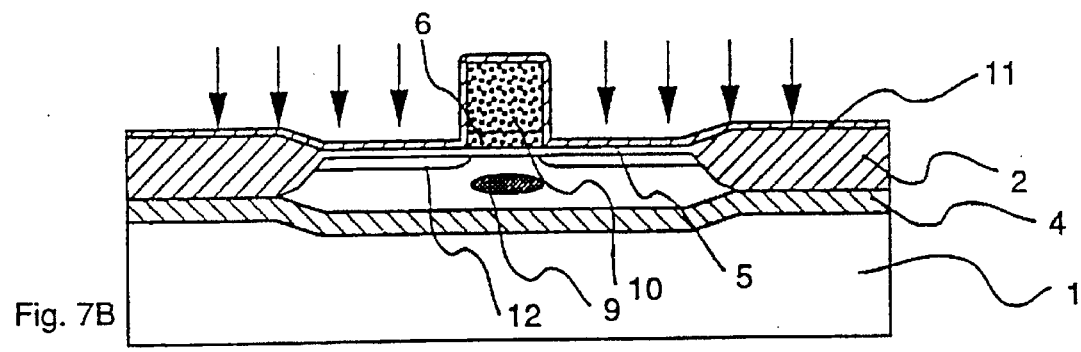

The etching of the tungsten film damages the gate oxide film at the end of the gate electrode 10. To recover the damage, the device is subjected to thermal processing. Further, as shown in FIG. 7B, a silicon dioxide film 11 to prevent contamination due to ion implantation is deposited, and then the ion implantation is performed to form a doped layer 12. In this process, to form a lightly doped layer with a lightly doped drain structure (LDD), the amount of impurity implanted was set at $1 \times 10^{13}$ to $1 \times 10^{14}/cm^2$. The impurity is phosphorus or arsenic. The thermal processing to recover the device from damage involves, in this embodiment, adjusting the pressures of oxygen and water vapor to oxidize the silicon substrate, not the tungsten film. This technique is disclosed in U.S. Pat. No. 4,505,028.

Figure 7C:
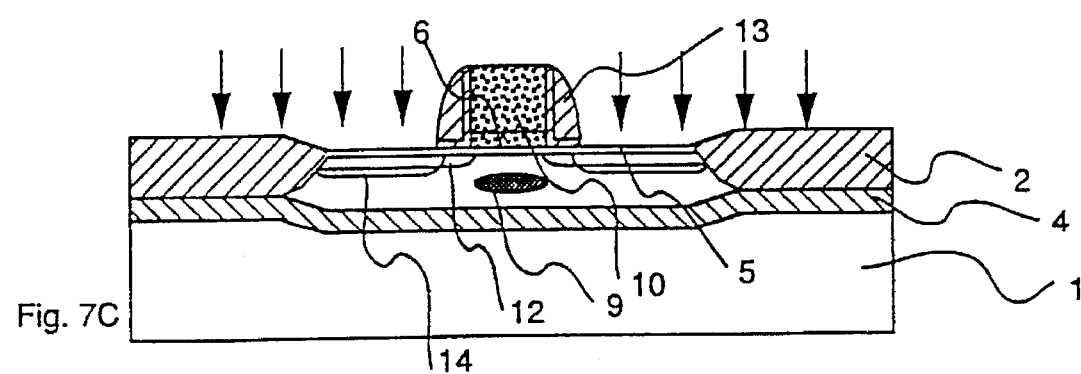

Next, as shown in FIG. 7C, by using a known technique which involves the steps of forming an insulating film over the semiconductor substrate having a raised portion and then performing an anisotropic dry etching, an insulating film 13 (silicon dioxide film deposited by plasma CVD) is formed only on the sidewalls of the tungsten film 10, 6. Further, $1 \times 10^{15}/cm^2$ of phosphorus or arsenic is implanted to form a highly doped layer 14.

Figure 7D:
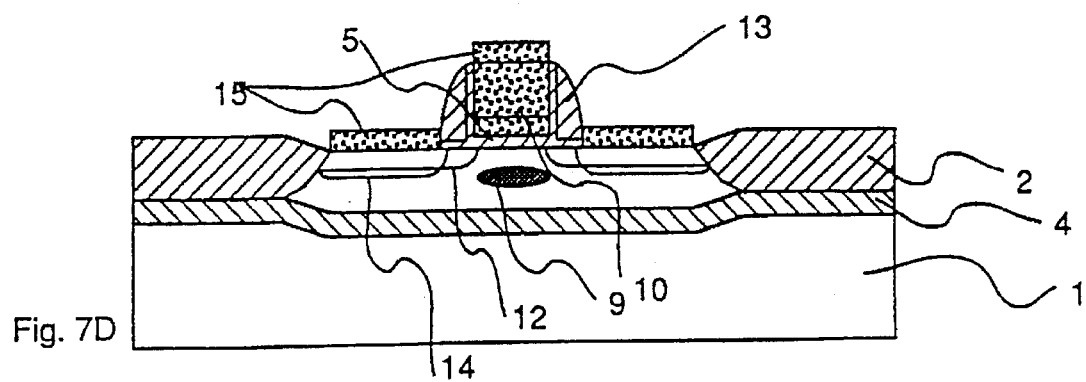

Next, as shown in FIG. 7D, a tungsten film 15 is selectively grown on the surfaces of the highly doped layer 14 where silicon is exposed and of the tungsten film 10 to reduce the resistance of the highly doped layer 14.

Figure 8A:
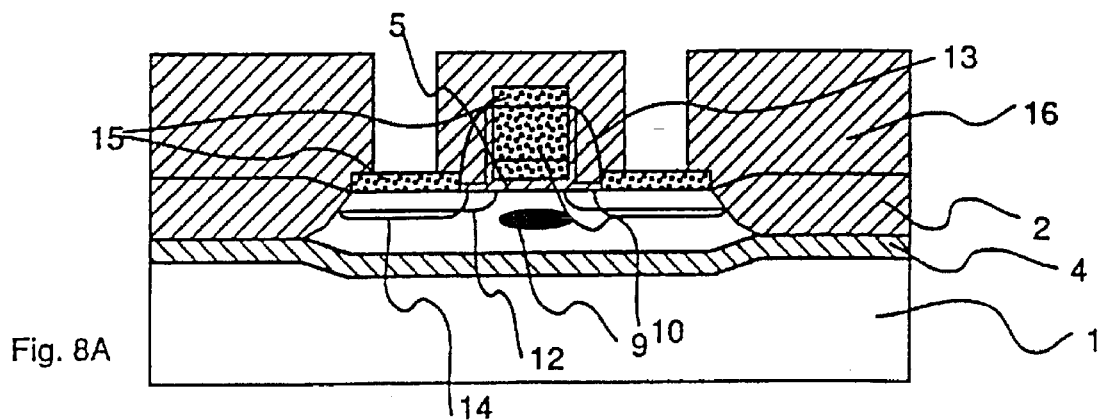

Next, as shown in FIG. 8A, the entire surface of the substrate is covered with an interlayer insulating film 16 and, by using a known lithography and dry etching techniques, contact holes are opened in the film that reach the tungsten film 15 on the surface of the highly doped layer 14, the gate electrode and further the substrate 1.

Figure 8B:
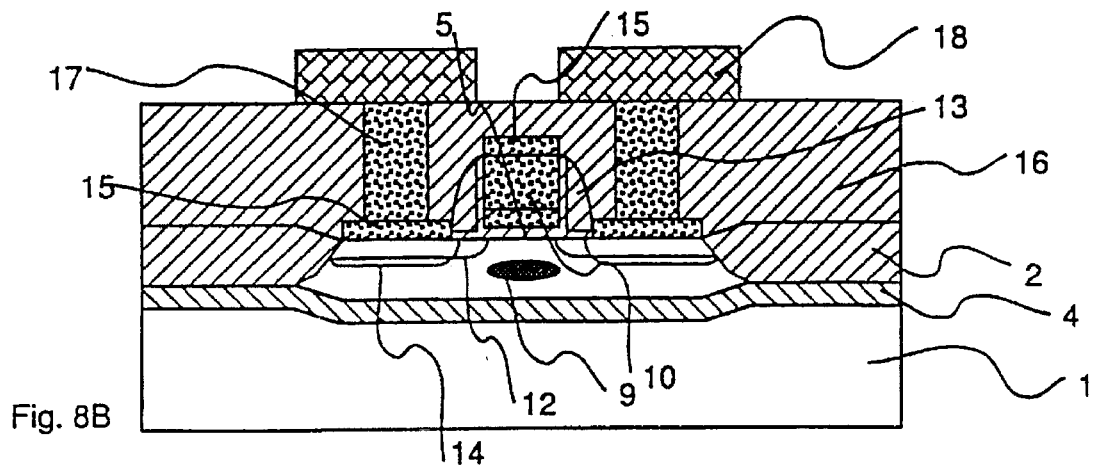

In the last step, as shown in FIG. 8B, after the contact holes are filled with a metal 17 (tungsten) by a known plug technology, an interconnect layer 18 is formed of a metal mainly of aluminum. When there are two or more interconnects, the process of forming the interlayer insulating film, opening the contact holes, filling and forming the interconnect layer is repeated.

Embodiment 2

In the first embodiment, as shown in FIG. 6D, beneath the selectively grown tungsten film 10 is formed the tungsten film 6 that contacts the gate insulating film 5 and which also covers the entire surface of the substrate. In the first embodiment, the bottom-layer tungsten film 6 is removed except at areas directly below the selectively grown tungsten film 10. It is, however, possible to form a MOSFET having a known gate-overlapped-drain structure by using a sidewall insulating film forming technique. This manufacturing process will be described by referring to FIGS. 9A to 9D, 10A to 10C and 11.

Figure 9A:
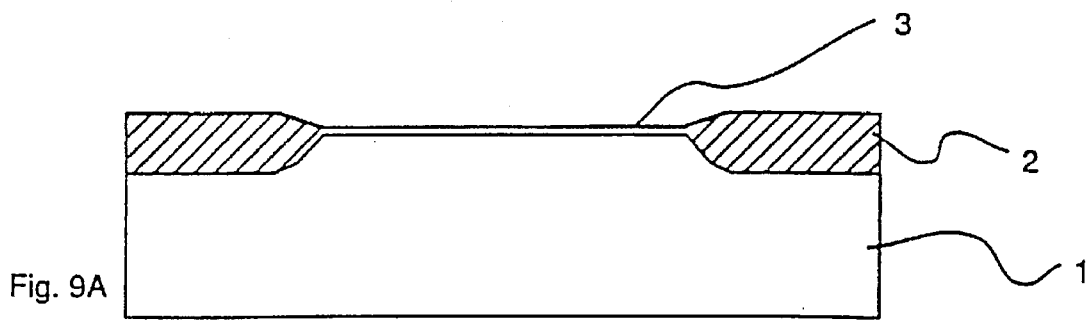
FIGS. 9A to 9D, FIGS. 10A to 10C and FIG. 11 are cross sections of a semiconductor device showing the process of making it according to the second embodiment of this invention.
Figure 9B:
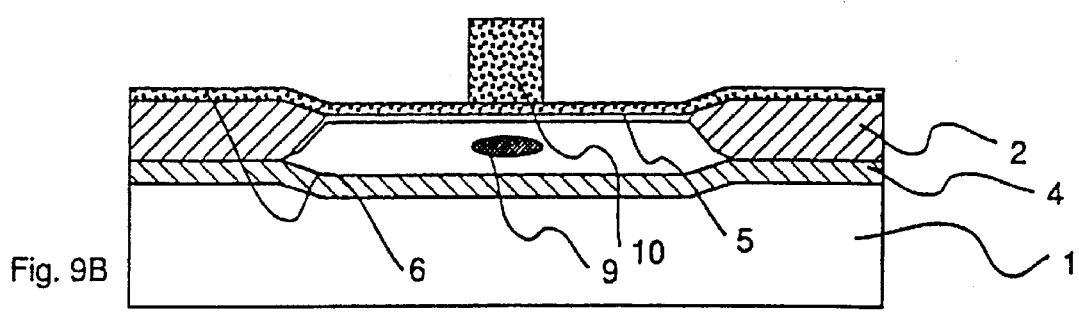

First, as in the case of the first embodiment, a semiconductor substrate having a selectively grown tungsten film 10 is prepared as shown in FIG. 9B.

Figure 9C:
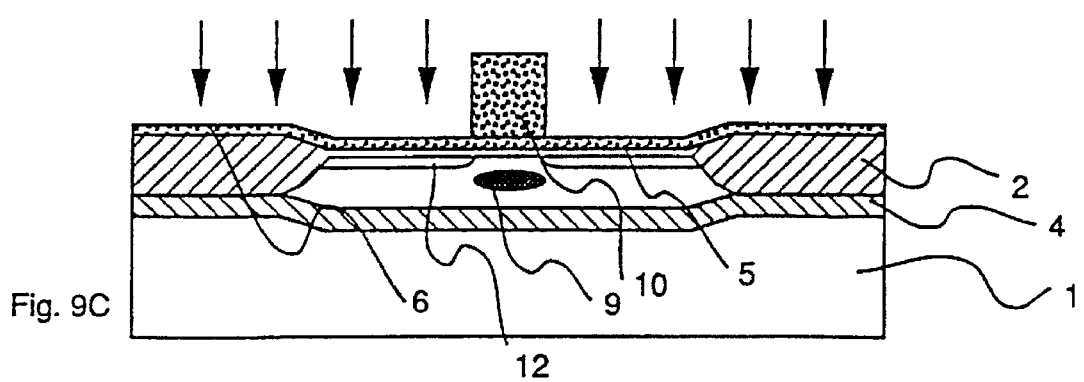

Next, as shown in FIG. 9C, before removing a part of the underlying tungsten film 6, a lightly doped layer 12 is formed by ion implantation under the same conditions as the first embodiment.

Figure 9D:
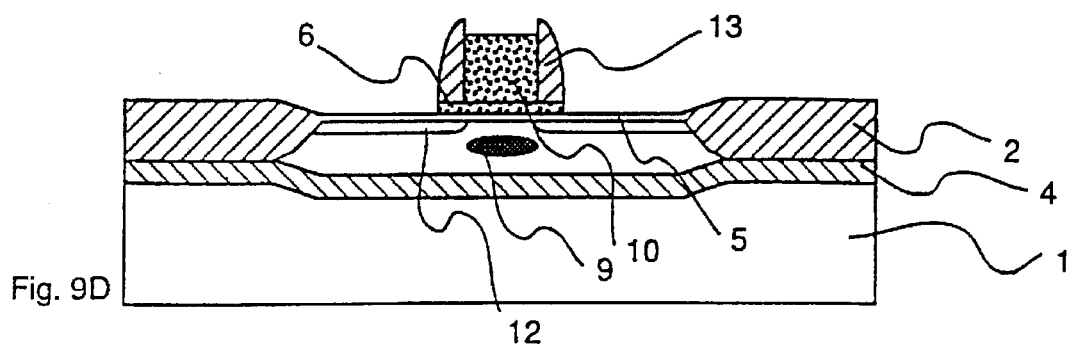

Then, as shown in FIG. 9D, a sidewall insulating film 13 is formed on the sidewall of the tungsten film 10 and, with this as a mask, the underlying tungsten film 6 is removed. As a result, the underlying tungsten film 6 becomes wider than the overlying tungsten film 10, with the lightly doped layer 12 formed in a substrate region below it. At the same time, a part of the surface of the tungsten film 10 is also removed, leaving the edge of the sidewall insulating film 13 as shown.

In the MOSFET of the first embodiment, as is apparent from the cross section of FIG. 8B, the overlapping between the tungsten film 10 and the lightly doped layer 12 is small and the doped layer below the sidewall insulating film 13 has a low impurity concentration and a high resistance. Hence, the conventional LDD structure cannot realize an increase in the current that is proportionate to the reduction in the gate size because of parasitic resistance.

In this embodiment, on the other hand, because an increase in resistance can be limited by the overlapping of the lightly doped layer 12 and the gate electrode, the current increases. Such a structure is called a gate-overlapped-drain structure and is already a known structure. Because the MOSFET of this embodiment uses a selective growth for the gate electrode, the gate-overlapped-drain structure can easily be realized simply by adding a process of making the sidewall insulating film 13.

Figure 10A:
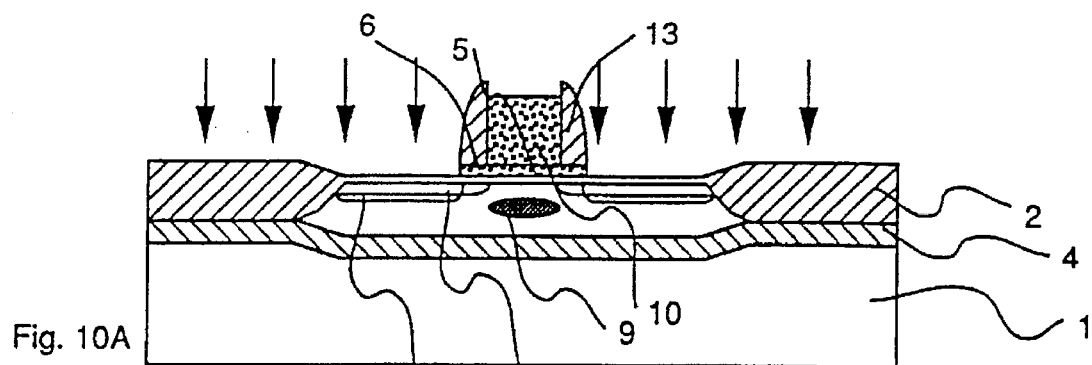

Then, as shown in FIG. 10A, ion implantation is performed to form a highly doped layer 14 under the same condition as the first embodiment.

Figure 10B:
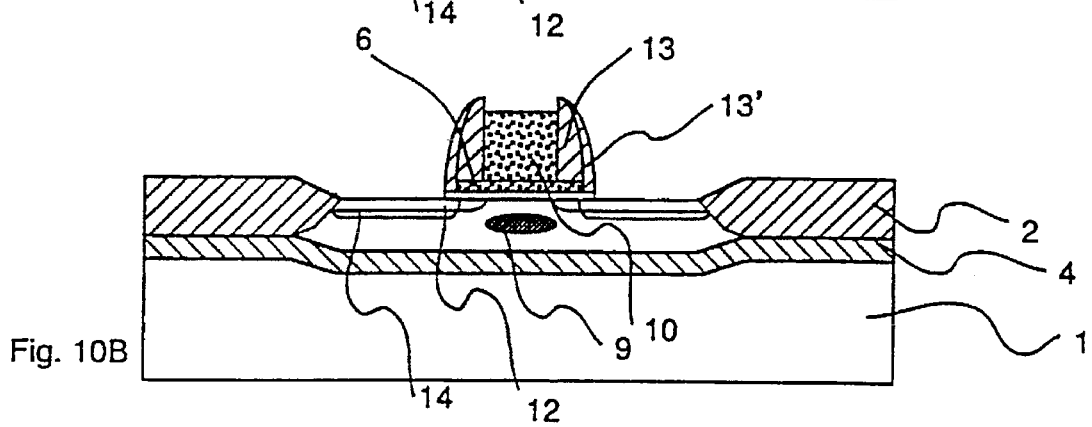
Figure 10C:
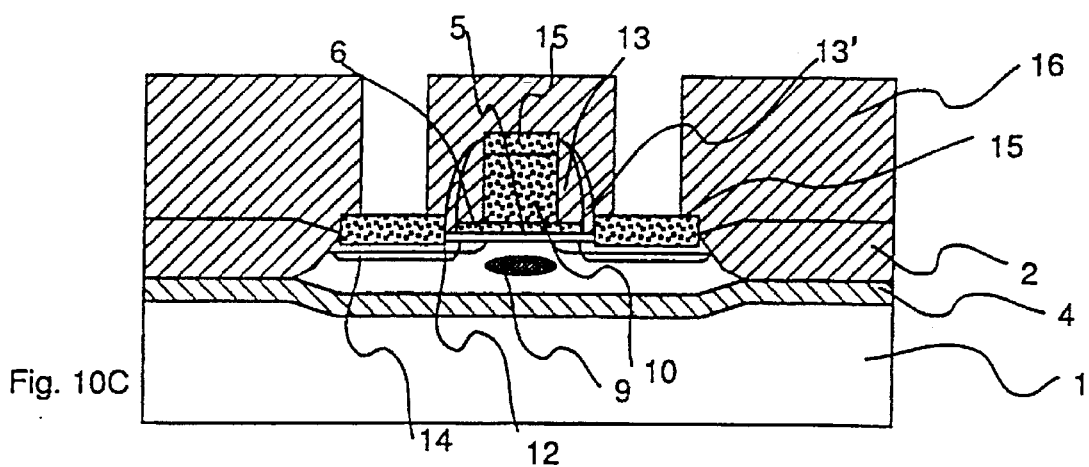

Next, in this embodiment, too, a tungsten film 15 is grown over the surface of the highly doped layer 14 as shown in FIG. 10C. To prevent a short-circuit between the tungsten film 15 and the protruding tungsten film 6, a second sidewall insulating film 13' is formed as shown in FIG. 10B.

The selective growth of the highly doped layer 14 and of the tungsten film 15 over the surface of the tungsten film 10 are carried out exactly under the same conditions as the first embodiment. The fact that the sidewall insulating film 13 rises higher than the surface of the tungsten film 10 effectively prevents connection between the tungsten film on the highly doped layer 14 and the tungsten film on the gate electrode during the process of selective growth.

Figure 11:
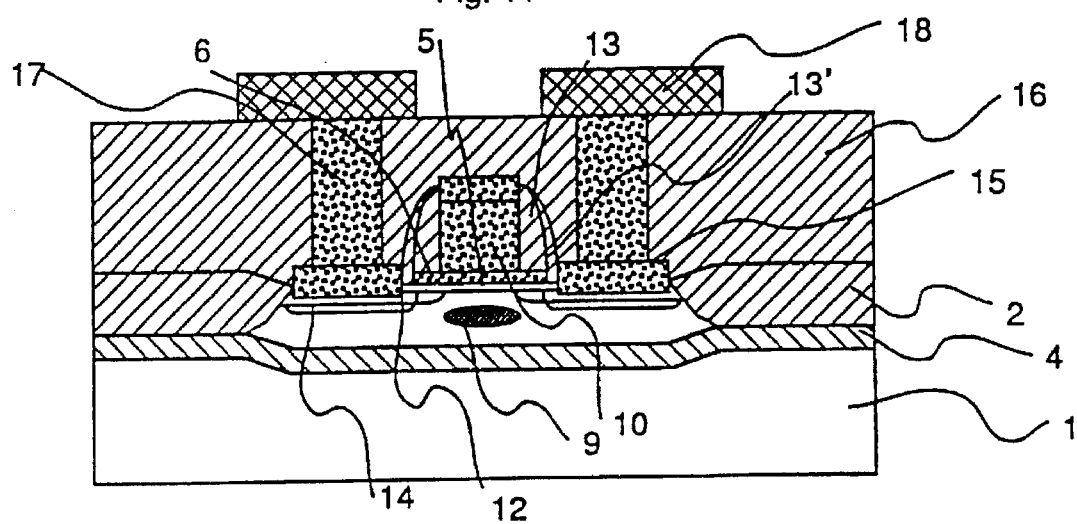

The interconnect making process is entirely the same as the first embodiment, as shown in FIGS. 10C and 11.

Embodiment 3

In the semiconductor devices of the first and second embodiment, the size of the gate electrode is determined by the size of the opening formed in the silicon dioxide film 7. Hence, by forming a sidewall insulating film on the sidewall of the opening by using a known method, it is possible to form a gate electrode smaller than the size determined by the lithography employed. The fabrication process is described by referring to FIGS. 12A to 12D, 13A to 13D and 14A to 14B.

Figure 12A:
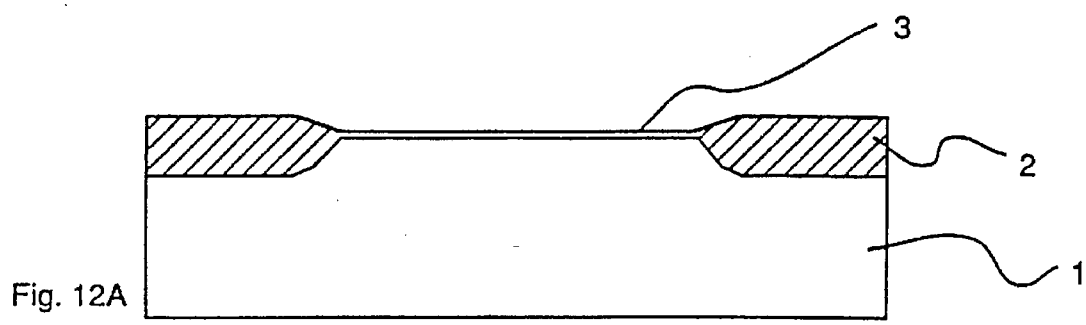
FIGS. 12A to 12D, FIGS. 13A to 13D and FIGS. 14A to 14B are cross sections of a semiconductor device showing the process of making it according to the third embodiment of this invention.

First, as in the case of the first and second embodiment, a semiconductor substrate 1 having a device isolation insulating film 2 is prepared as shown in FIG. 12A.

Figure 12B:
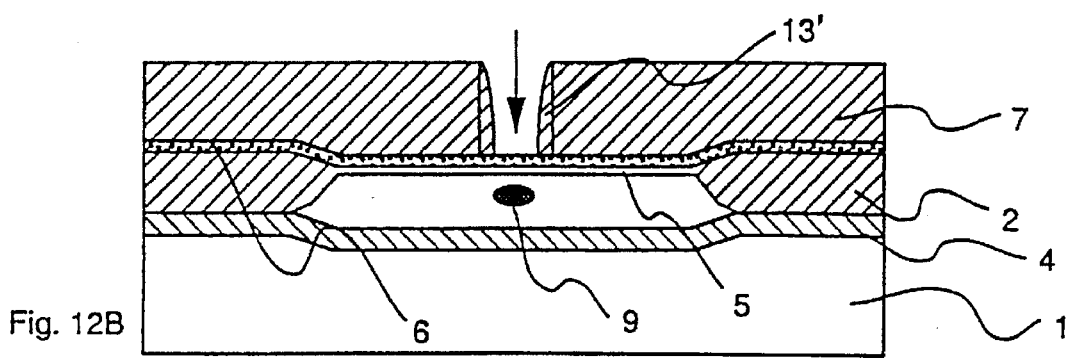

Next, as shown in FIG. 12B, a gate oxide film 5 is grown and a tungsten film 6 forming a part of the gate electrode are formed. Further, the silicon dioxide film 7 is formed with an opening. The procedure to this point is the same as the first and second embodiment. This embodiment uses a known technique to form a sidewall insulating film 13' on the sidewall of the opening. This is easily realized by depositing an insulating film over the surface of the substrate and then performing a known anisotropic dry etching. The punch-through stopper 9 is formed under the same condition as the first embodiment.

In this way, by forming the sidewall insulating film in the opening, the size of the opening can be reduced. With the conventional optical lithography, the width of the opening can be reduced only to about 0.3 µm even when using an i-ray lithography with wavelength of 365 nm. If a 0.1-µm sidewall insulating film, is formed in this opening, the gate electrode size will be about 0.1 µm. This size is the one that would normally be able to be realized only by using an electron ray lithography. The fact that such a small gate electrode can be formed by the conventional optical lithography means that a cost increase that would accompany the use of expensive equipment can be avoided.

The succeeding process is totally the same as the first embodiment and thus is only briefly explained here.

Figure 12C:
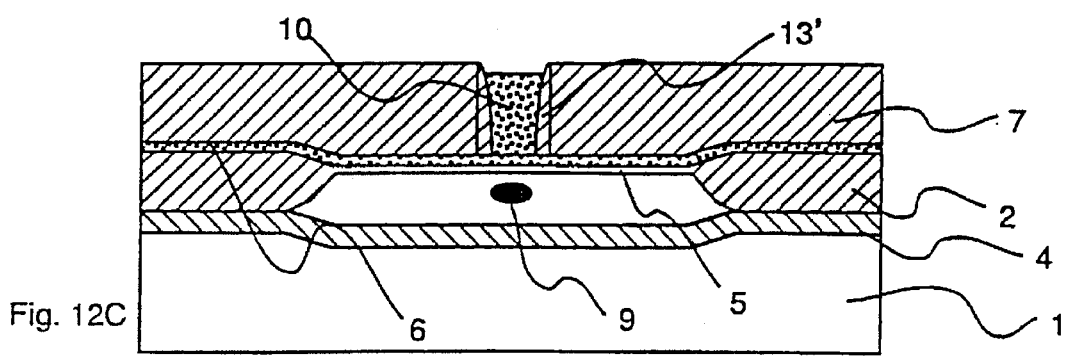
Figure 12D:
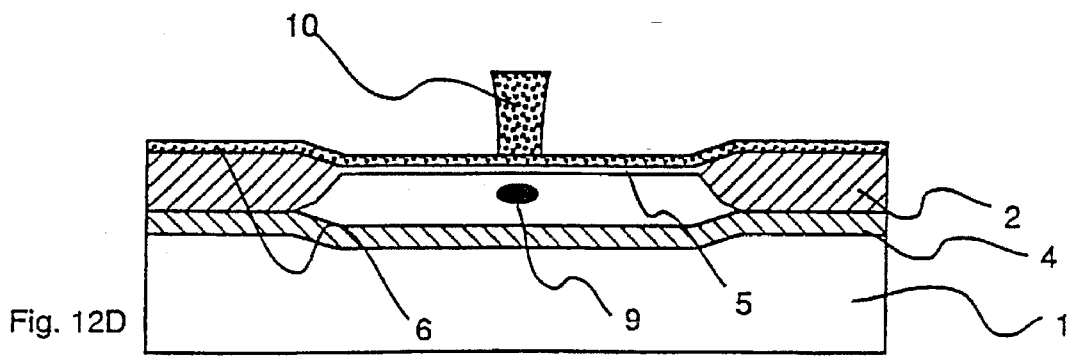
Figure 13A:
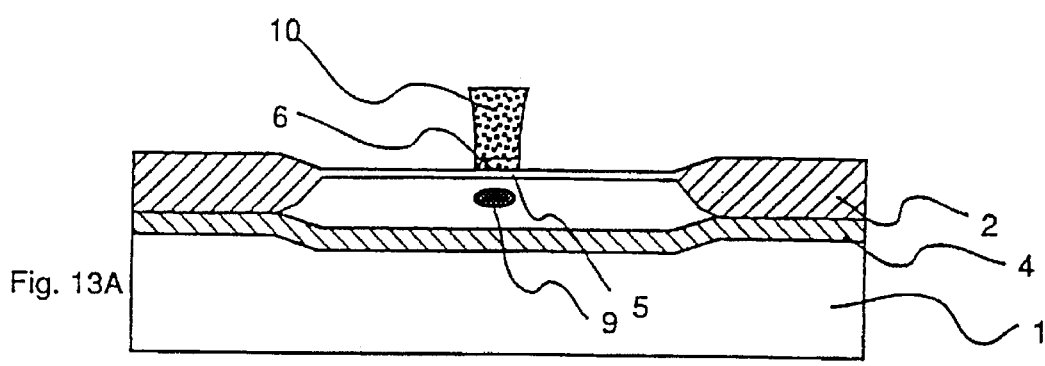
Figure 13B:
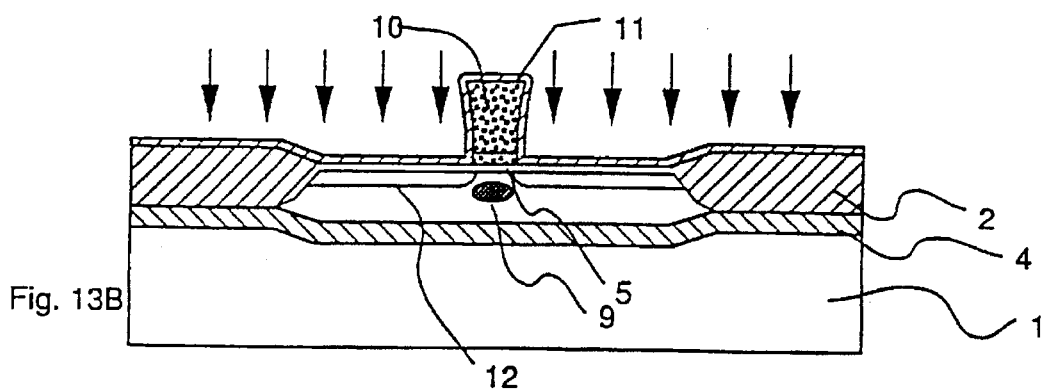
Figure 13C:
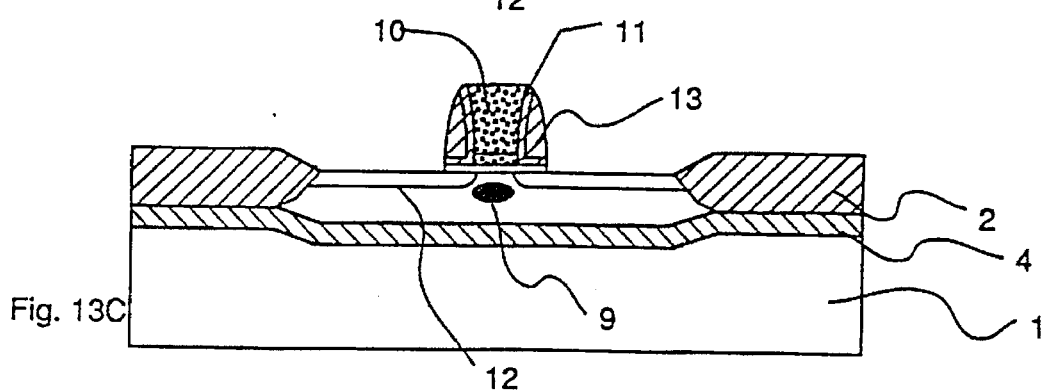
Figure 13D:
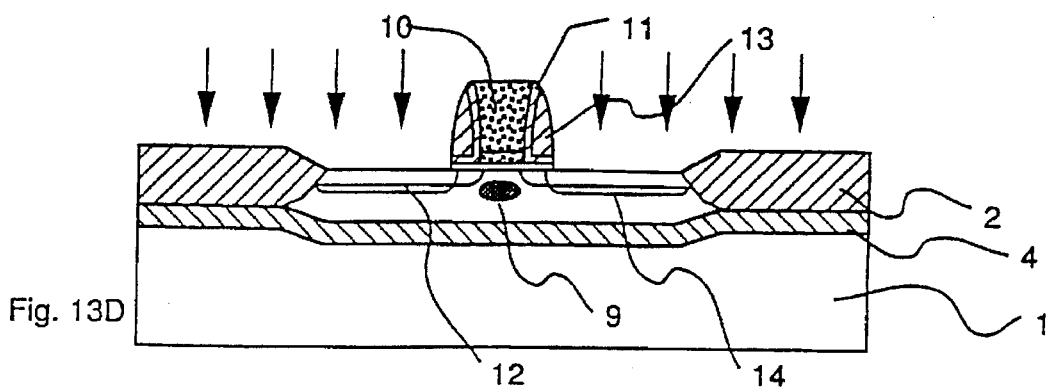
Figure 14A:
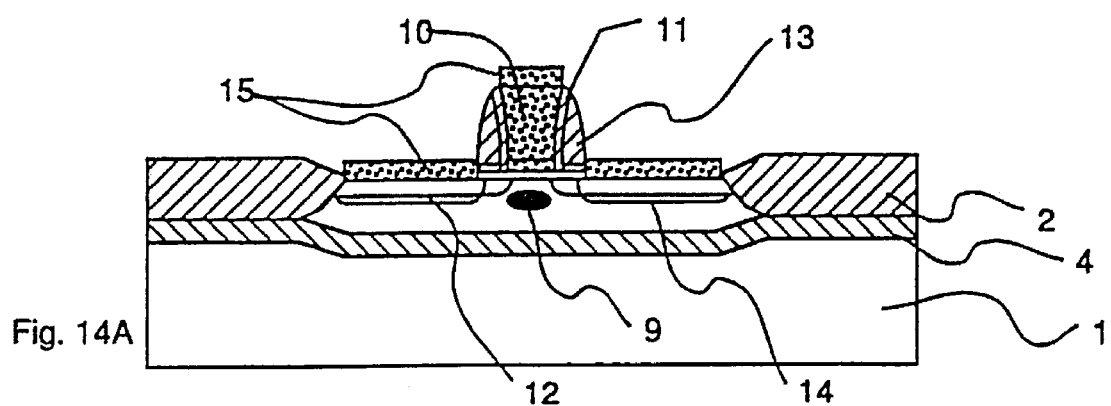
Figure 14B:
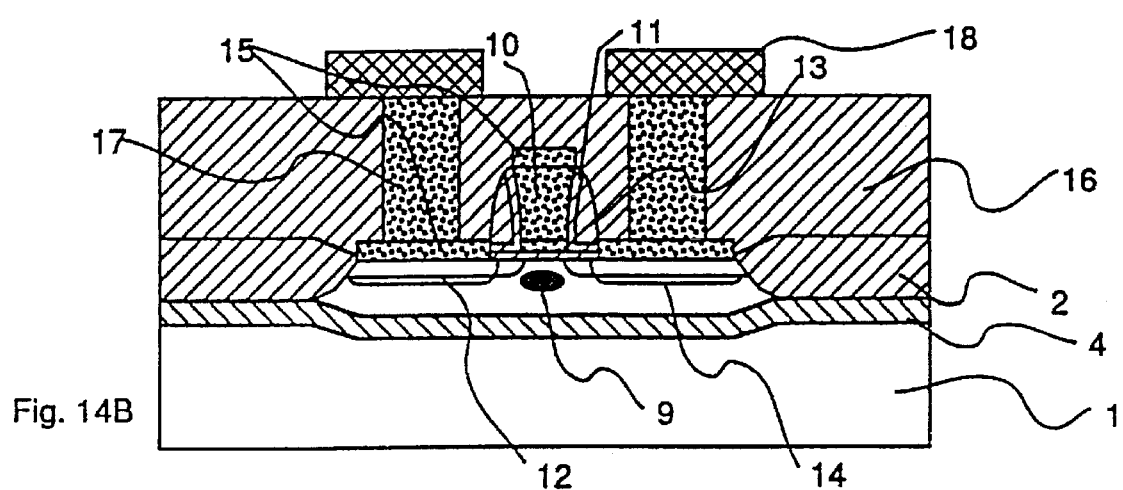

As shown in FIG. 12C, a tungsten film 10 is selectively grown in the interior of the opening. Then, as shown in FIG. 12D, the silicon dioxide films 7, 13' in which the opening is formed are removed to leave the tungsten film 10. Next, as shown in FIG. 13A, the tungsten film 6 covering the entire surface of the substrate is removed. Then, as shown in FIG. 13B, the tungsten film 10 is covered with a silicon dioxide film 11 and a lightly doped layer 12 is formed by ion implantation. Then, as shown in FIG. 13C, a sidewall insulating film 13 is formed on the sidewall of the tungsten film 10 and, with this as a mask, a highly doped layer 14 is formed as shown in FIG. 13D. Then, as shown in FIG. 14A, a tungsten film 15 is grown on the surfaces of the highly doped layer 14 and tungsten film 15. In the last step, interconnects are formed as shown in FIG. 14B.

While explanation here has proceeded along the process of the first embodiment, it is also possible to make the gate-overlapped-drain structure like the second embodiment.

Embodiment 4

In the first to third embodiment, what is in contact with the gate oxide film 5 is a tungsten film 6, over which a tungsten film is locally grown to form a gate electrode. In the first embodiment, this is represented by FIG. 6B and 6C. For this reason, the punch-through stopper 9 is formed through the tungsten film 6 and there is a possibility of the substrate being contaminated by the tungsten. Heavy metal contamination will shorten the carrier life time and increase junction leakage. When the tungsten contamination becomes a problem, it can be dealt with by forming the punch-through stopper through a polysilicon film and then replacing the polysilicon silicon film with the tungsten. While the polysilicon film may be used as is as part of the gate electrode, realization of micro-fine MOSFETs requires the gate electrodes to have different conductivity types, a fact pointed out as one of the problems with the conventional technologies. Therefore, we take an example in which the polysilicon film is replaced with the tungsten, with reference to FIGS. 15A to 15D, 16A to 16D and 17A to 17C.

Figure 15A:
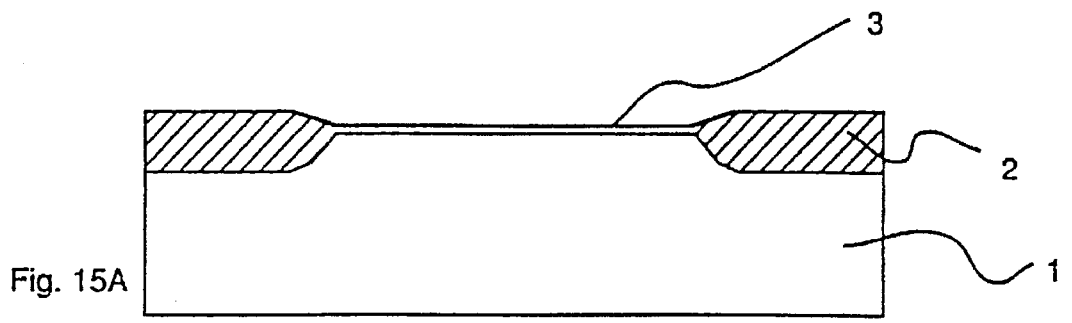

First, as in the case of the first to fourth embodiment, a semiconductor substrate 1 having a device isolation insulating film 2 is prepared as shown in FIG. 15A.

Figure 15B:
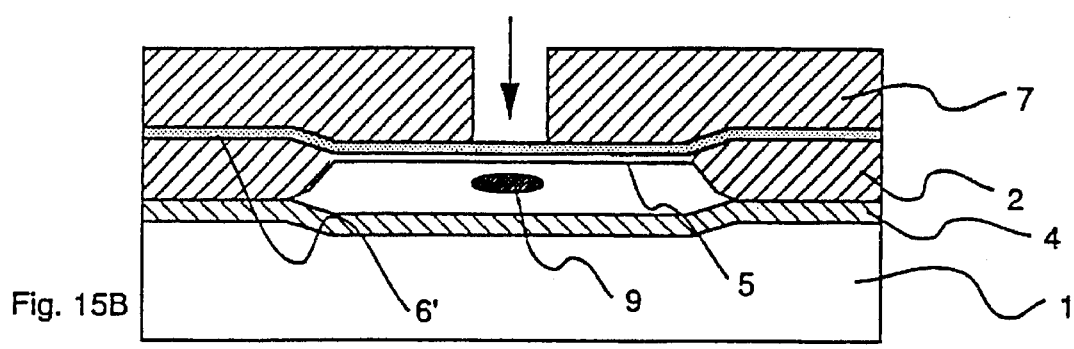

Then, as shown in FIG. 15B, a gate oxide film 5 is grown and a polysilicon film 6' is deposited as part of the gate electrode to a thickness of about 20 nm. Then, the silicon dioxide film 7 is formed with an opening, through which a punch-through stopper 9 is formed in the interior of the substrate.

Figure 15C:
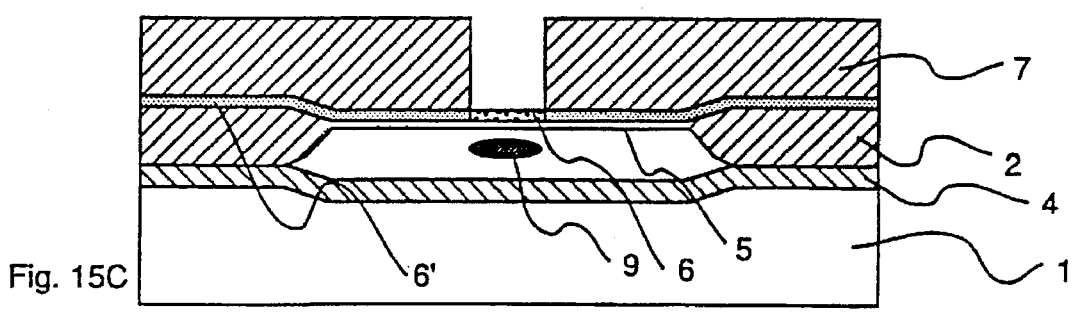

Next, as shown in FIG. 15C, the exposed polysilicon film 6' is replaced with a tungsten film 6. A $WF_6$ gas is supplied to react with silicon, with the result that the silicon is removed as a volatile gas $SiF_4$ leaving tungsten W. Because $WF_6$ does not react with the oxide film, the oxide film forming the opening remains as is. Even when the replacement reaction with a polysilicon progresses further, the gate oxide film 5 does not react with tungsten.

Figure 15D:
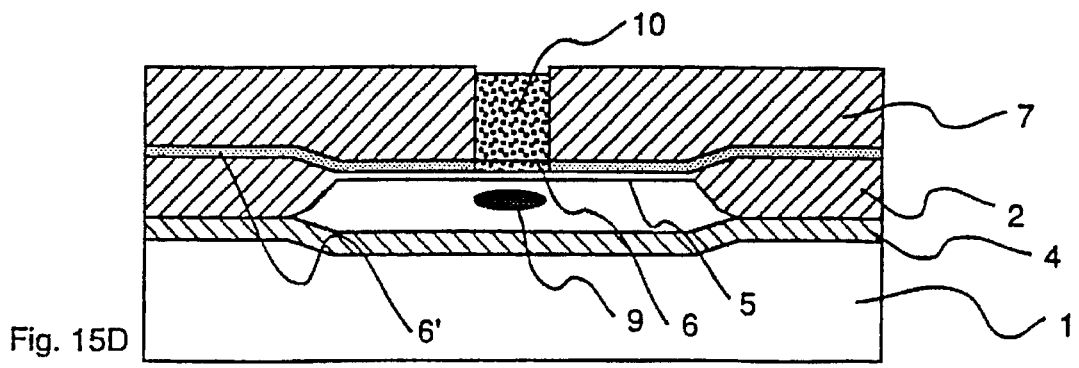
Figure 17A:
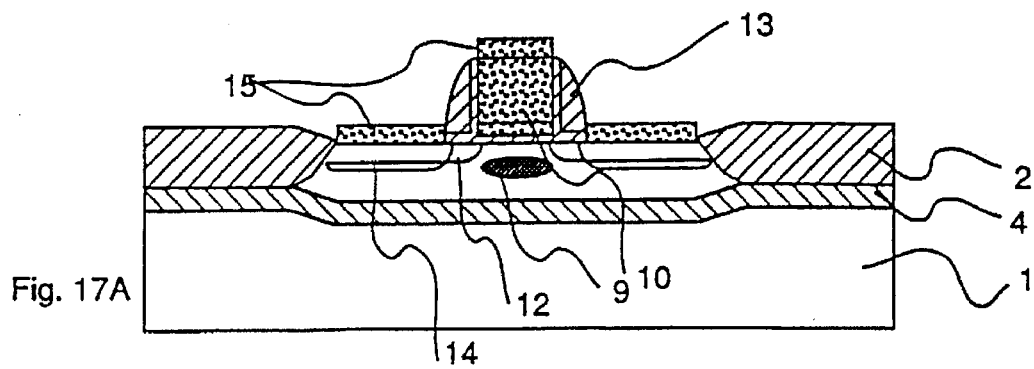
Figure 17B:
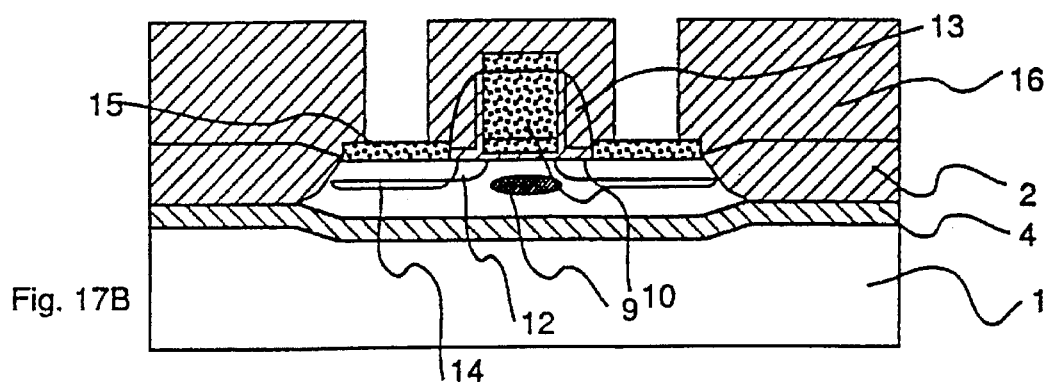
Figure 17C:
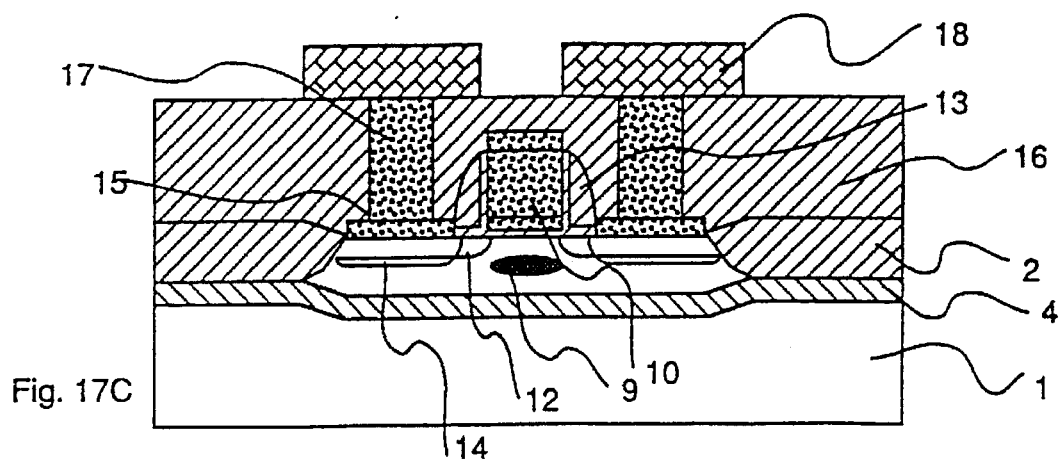

Next, as shown in FIG. 15D, a tungsten film 10 is selectively grown over the surface of the replaced tungsten film 6 by the method described above.

Then, as shown in FIG. 16A, the silicon dioxide film 7 in which the opening is formed is removed. Further, as shown in FIG. 16B, the polysilicon film 6' covering the entire surface of the substrate is etched away. In the preceding first to third embodiments the tungsten film is removed. In this embodiment, on the other hand, the polysilicon film is removed. As mentioned earlier, the polysilicon film has the advantage of being able to easily secure a specified selectivity ratio with respect to the underlying oxide film. In the preceding embodiments, etching of the tungsten film on the gate oxide film is done by reducing the thickness of the tungsten film to be removed. In this embodiment the problems associated with the etching of the gate electrode are eliminated by using a polysilicon that is easily etched.

FIGS. 16C to 16D and 17A to 17C are entirely the same as the preceding embodiments and thus explanation is omitted.

Embodiment 5

Next, by referring to FIGS. 18A to 18D and 19A to 19D, we will describe an example of making a CMOS using the semiconductor device explained in the first embodiment. As already mentioned, the semiconductor device of this invention can be formed as an N-channel or P-channel MOSFET by changing the conductivity type of the doped layer. This is exactly the same as with the conventionally structured MOSFETs. The process of forming a CMOS, therefore, involves preparing a substrate having regions with different conductivity types and making semiconductor devices of N and P types alternately on the substrate.

Figure 18A:
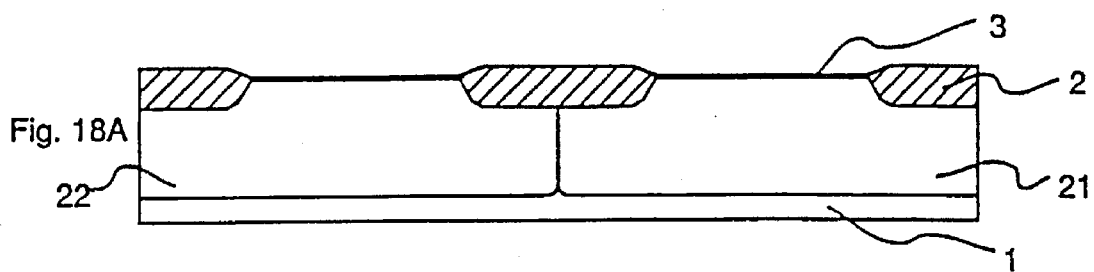
FIGS. 18A to 18D and FIGS. 19A to 19D are cross sections of a semiconductor device showing the process of making it according to the fifth embodiment of this invention.

First, as mentioned in FIG. 18A, a semiconductor substrate 1 having doped layers 21, 22 of different conductivity types and a device isolation insulating film 2 is prepared. For convenience of explanation, the doped layer 21 is taken as a P type region where an N-channel MOSFET is to be formed, and the doped layer 22 is taken as an N type region where a P-channel MOSFET is to be formed.

Figure 18B:
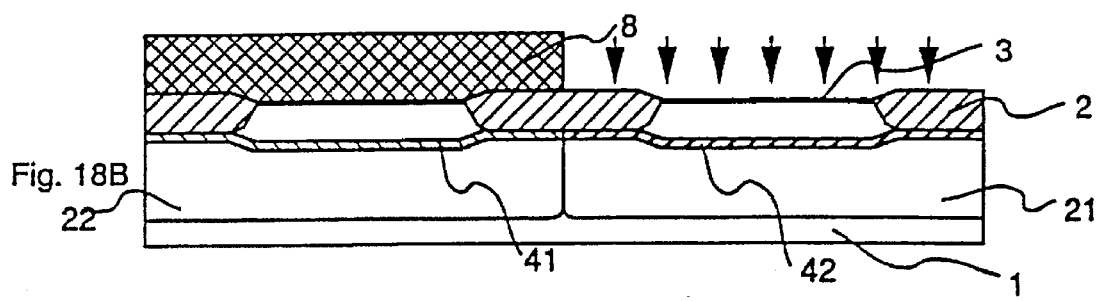

In each region, ion implantation is done to improve the device isolation characteristic, as shown in FIG. 18B. Through a patterned resist film, boron 42 is introduced into the doped layer 21 and phosphorus 41 into the doped layer 22.

Figure 18C:
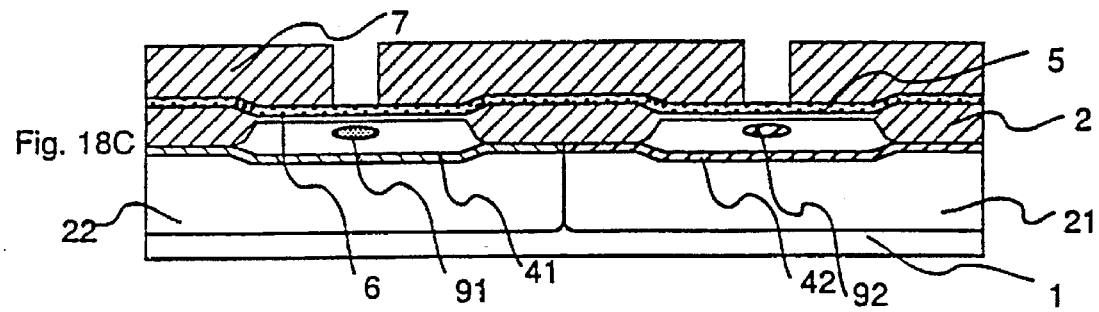

Then, as shown in FIG. 18C, a gate oxide film 5 is grown over the entire surface and then a tungsten film 6 forming part of the gate electrode is deposited. This is followed by forming, as in the preceding embodiments, openings in the silicon dioxide film 7 and punch-through stoppers 91, 92. The punch-through stopper 92 is formed by ion implantation of boron and the other 91 by arsenic.

Figure 18D:
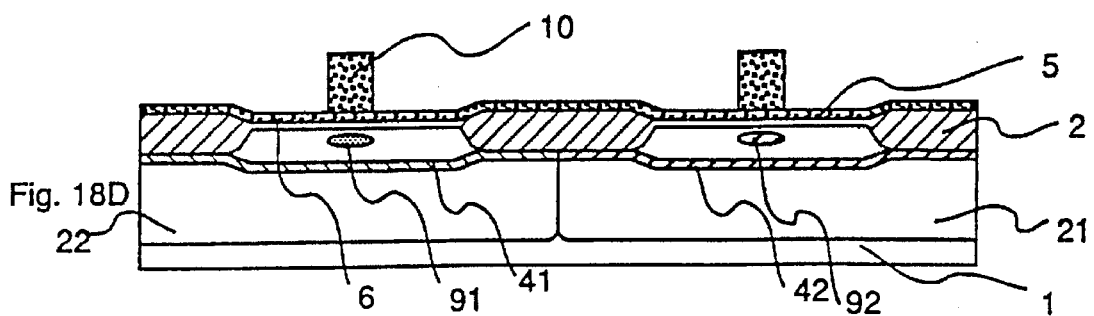

Then, as shown in FIG. 18D, a tungsten film 10 is grown in the opening and then the silicon dioxide film 7 is removed.

Figure 19A:
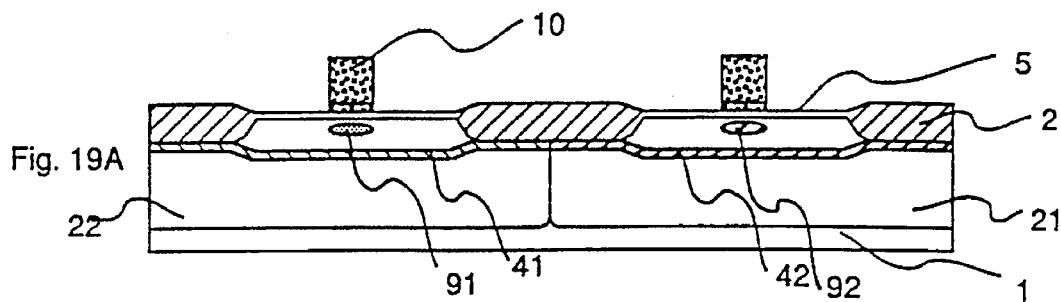
Figure 19B:
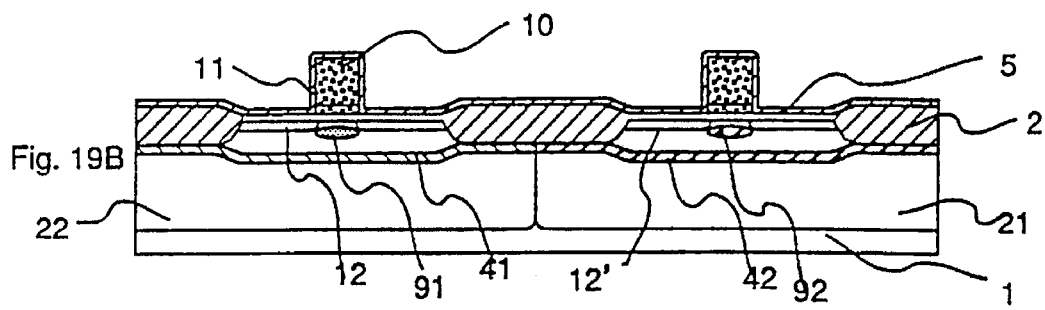

Next, as shown in FIG. 19A, the tungsten film covering the surface of the substrate is removed and, as in the case of the first embodiment, a silicon dioxide film 11 is deposited over the entire surface (FIG. 19B). Then, lightly doped layers 12, 12' are formed. The lightly doped layer 12 has a P type conductivity and the other layer 12' an N type conductivity.

Figure 19C:
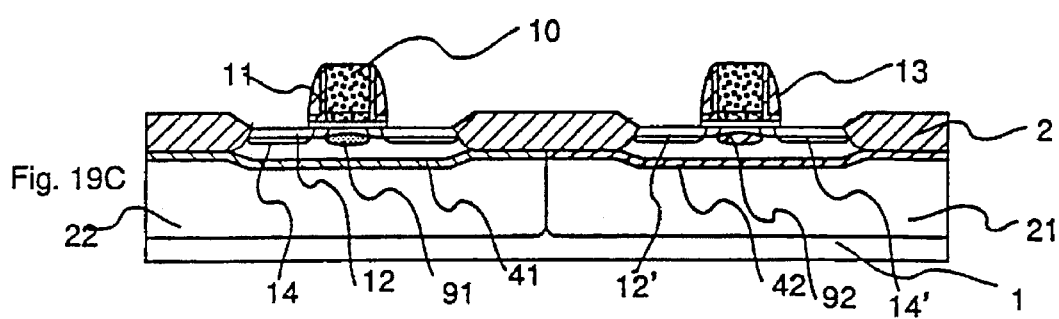
Figure 19D:
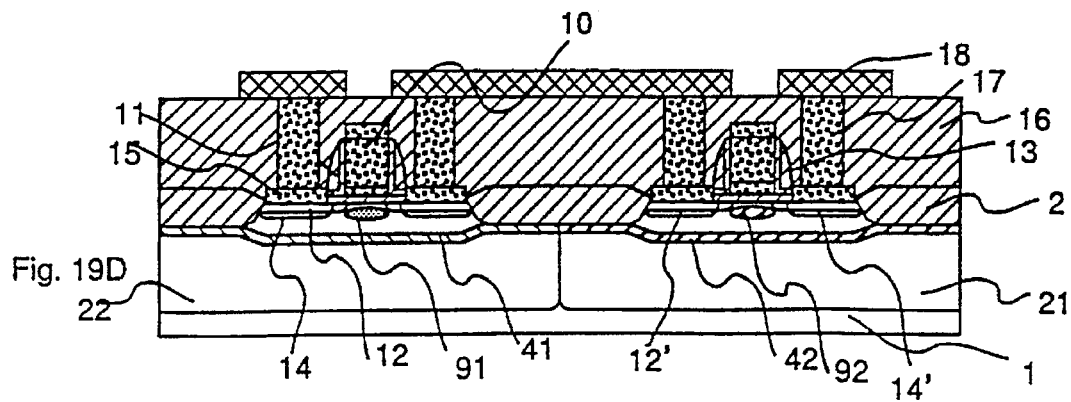

Then, as shown in FIG. 19C, a sidewall insulating film 13 is formed and highly doped layers 14, 14' are then formed. In the last step, as shown in FIG. 19D, interconnects are formed to complete the CMOS.

As explained in these five embodiments, the semiconductor device manufacturing method of this invention makes it possible to use as a gate electrode of MOSFET with a very thin gate oxide film a material of tungsten which has a small ohmic resistance and a good resistance against thermal processing. This is because the fabrication method used reduces the thickness of the tungsten film to be etched. For a MOSFET whose gate insulating film is thin and its gate length is about 0.1 μm, the conventional method of etching a thick tungsten film into the gate electrode shape cannot be used.

The use of tungsten for the gate electrode offers the advantages of reducing the gate resistance and also obviating the need for a structure having gate electrodes of different conductivity types, a factor that is considered essential in micro-fine MOSFETs.

The forming of a gate electrode by selectively depositing a metal in the opening in the insulating film allows a punch-through stopper to be formed locally. As a result, the PN junction capacitance is significantly reduced, which, in combination With the reduction in the gate electrode, greatly contributes to the improvement of the device performance.

The semiconductor device fabrication method of this invention, with addition or modification of only few steps, can realize a gate-overlapped-drain structure. It also can reduce the gate electrode size below the lithography limit. These combine to make for a significant improvement of the device performance.

It is further understood by those skilled in the art that the foregoing description is preferred embodiments of the disclosed device and that various changes and modifications may be made in the invention without departing from the spirit and scope thereof.

We claim:

1. A method of manufacturing a semiconductor device comprising:
    a first step of forming a first insulating film over the surface of a first region in a semiconductor body;
    a second step of forming a first metal film over the first insulating film, by a sputtering process;
    a third step of forming a second insulating film of a desired shape over the first metal film;
    a fourth step of selectively forming a second metal film over the first metal film exposed after the third step;
    a fifth step of removing the second insulating film after the fourth step;
    a sixth step of removing the first metal film exposed after the fifth step; and
    a seventh step of introducing a first impurity into the first region with the second metal film as a mask after the sixth step to form a first impurity region of a conductivity type different from that of the first region.

2. A method of manufacturing a semiconductor device according to claim 1, wherein in the fourth step, the second metal film is formed by chemical vapor deposition.

3. A method of manufacturing a semiconductor device according to claim 1, further comprising an eighth step provided between the third step and the fourth step, which introduces a second impurity into the first region with the second insulating film as a mask to form a second impurity region.

4. A method of manufacturing a semiconductor device according to claim 3, wherein the second impurity is boron or arsenic.

5. A method of manufacturing a semiconductor device according to claim 1, further comprising a ninth step after the seventh step which forms a third insulating film on sidewalls of the first metal film and the second metal film.

6. A method of manufacturing a semiconductor device according to claim 5, further comprising a tenth step after the ninth step which introduces a third impurity into the first region with the third insulating film as a mask to form a third impurity region.

7. A method of manufacturing a semiconductor device according to claim 6, wherein the third impurity is phosphorus or arsenic.

8. A method of manufacturing a semiconductor device according to claim 5, wherein the third insulating film is a silicon dioxide film.

9. A method of manufacturing a semiconductor device according to claim 1, further comprising an eleventh step between the sixth step and the seventh step, which forms a fourth insulating film on the first region, and a twelfth step after the seventh step which removes the fourth insulating film.

10. A method of manufacturing a semiconductor device according to claim 9, wherein the fourth insulating film is a silicon dioxide film.

11. A method of manufacturing a semiconductor device according to claim 1, wherein the first insulating film is a silicon dioxide film.

12. A method of manufacturing a semiconductor device according to claim 1, wherein the second insulating film is a silicon dioxide film.

13. A method of manufacturing a semiconductor device according to claim 1, wherein the first metal film is tungsten.

14. A method of manufacturing a semiconductor device according to claim 1, wherein the second metal film is tungsten.

15. A method of manufacturing a semiconductor device according to claim 1, wherein the first impurity is phosphorus or arsenic.

16. A method of manufacturing a semiconductor device according to claim 1, wherein in the fourth step, a gas mixture of $WF_6$ and $H_2$ or of $WF_6$ and $SiH_4$ is used in forming the second metal film.

17. A method of manufacturing a semiconductor device according to claim 1, wherein the first metal film has a thickness in a range of 0.3–50 nm.

18. A method of manufacturing a semiconductor device according to claim 1, further comprising a thirteenth step of forming a third metal film on the second metal film and on the first impurity region.

19. A method of manufacturing a semiconductor device comprising:

a step of forming a device isolation insulating film around a first region of a semiconductor body having a first conductivity type;

a step of forming a gate insulating film in the first region;

a step of forming a first tungsten film on the semiconductor body having the gate insulating film, by a sputtering process;

a step of forming on the first tungsten film a third insulating film having an opening at a specified area of the first region;

a step of introducing a first impurity into the semiconductor body through the opening in the third insulating film to form a punch-through stopper of a first conductivity type;

a step of selectively depositing inside the opening in the third insulating film a second tungsten film thicker than the first tungsten film;

a step of removing the third insulating film;

a step of removing an exposed portion of the first tungsten film;

a step of forming a fourth insulating film on a sidewall of a layered film of the first and second tungsten films; and a step of introducing a second impurity into the semiconductor body to form a source and a drain both having a second conductivity type opposite to the first conductivity type.

20. A method of manufacturing a semiconductor device according to claim 19, wherein the first and second tungsten films form a gate electrode of the semiconductor device, and wherein the punch-through stopper is formed only directly below the gate electrode.

21. A method of manufacturing a semiconductor device according to claim 19, wherein the first tungsten film has a thickness in a range of 0.3–50 nm.

22. A method of manufacturing a semiconductor device according to claim 19, comprising a further step of forming a third tungsten film on the second tungsten, on the source and on the drain.

23. A method of manufacturing a semiconductor device comprising:

a step of forming a device isolation insulating film around a first region of a semiconductor body having a first conductivity type;

a step of introducing a first impurity into the semiconductor body having the device isolation insulating film to form a first impurity doped layer of a first conductivity type;

a step of forming a gate insulating film in the first region;

a step of forming a first tungsten film on the semiconductor body having the gate insulating film, by a sputtering process;

a step of forming on the first tungsten film a third insulating film having an opening at a specified area of the first region;

a step of introducing a second impurity through the opening in the third insulating film into the semiconductor body to a depth shallower than the first impurity doped layer to form a punch-through stopper of a first conductivity type;

a step of selectively depositing inside the opening in the third insulating film a second tungsten film thicker than the first tungsten film;

a step of removing the third insulating film;

a step of removing an exposed portion of the first tungsten film;

a step of forming a fourth insulating film on a sidewall of a layered film of the first and second tungsten films; and a step of introducing a second impurity into the semiconductor body to form a source and a drain both having a second conductivity type opposite to the first conductivity type.

24. A method of manufacturing a semiconductor device comprising:

a step of forming a device isolation insulating film around a first region of a semiconductor body having a first conductivity type;

a step of forming a gate insulating film in the first region;

a step of forming a first tungsten film on the semiconductor body having the gate insulating film, by a sputtering process;

a step of forming on the first tungsten film a third insulating film having an opening at a specified area of the first region;

a step of introducing a first impurity into the semiconductor body through the opening in the third insulating film to form a punch-through stopper of a first conductivity type;

a step of selectively depositing inside the opening in the third insulating film a second tungsten film thicker than the first tungsten film;

a step of removing the third insulating film; a step of forming a fourth insulating film on a sidewall of the second tungsten film;

a step of removing an exposed portion of the first tungsten film;

a step of forming a fifth insulating film on a sidewall of the first tungsten film; and a step of introducing a second impurity into the semiconductor body to form a source and a drain both having a second conductivity type opposite to the first conductivity type.

25. A method of manufacturing a semiconductor device comprising:

a step of forming a device isolation insulating film around a first region of a semiconductor body having a first conductivity type;

a step of forming a gate insulating film in the first region;

a step of forming a first tungsten film on the semiconductor body having the gate insulating film, by a sputtering process;

a step of forming on the first tungsten film a third insulating film having a first opening at a specified area of the first region;

a step of forming inside the first opening in the third insulating film a fourth insulating film having a second opening;

a step of introducing a first impurity into the semiconductor body through the second opening in the fourth insulating film to form a punch-through stopper of a first conductivity type;

a step of selectively depositing inside the second opening in the fourth insulating film a second tungsten film thicker than the first tungsten film;

a step of removing the third and fourth insulating films;

a step of removing an exposed portion of the first tungsten film;

a step of forming a fifth insulating film on a sidewall of a layered film of the first and second tungsten films; and a step of introducing a second impurity into the semiconductor body to form a source and a drain both having a second conductivity type opposite to the first conductivity type.

26. A method of manufacturing a semiconductor device comprising:

a step of forming a device isolation insulating film around a first region of a semiconductor body having a first conductivity type;

a step of forming a gate insulating film in the first region;

a step of forming a first tungsten film on the semiconductor body having the gate insulating film, by a sputtering process;

a step of forming on the first tungsten film a third insulating film having a first opening at a specified area of the first region;

a step of forming inside the first opening in the third insulating film a fourth insulating film having a second opening;

a step of introducing a first impurity into the semiconductor body through the second opening in the fourth insulating film to form a punch-through stopper of a first conductivity type;

a step of selectively depositing inside the second opening in the fourth insulating film a second tungsten film thicker than the first tungsten film;

a step of removing the third and fourth insulating films;

a step of forming a fifth insulating film on a sidewall of the second tungsten film;

a step of removing an exposed portion of the first tungsten film;

a step of forming a sixth insulating film on a sidewall of the first tungsten film; and a step of introducing a second impurity into the semiconductor body to form a source and a drain both having a second conductivity type opposite to the first conductivity type.

27. A method of manufacturing a semiconductor device comprising:

a step of forming a device isolation insulating film around a first region of a semiconductor body having a first conductivity type;

a step of forming a gate insulating film in the first region;

a step of forming a silicon film on the semiconductor body having the gate insulating film;

a step of forming on the silicon film a third insulating film having an opening at a specified area of the first region;

a step of doping a first impurity into the semiconductor body through the opening in the third insulating film to form a punch-through stopper of the first conductivity type;

a step of replacing the silicon film inside the opening in the third insulating film with a first tungsten film, after the step of doping the first impurity;

a step of selectively depositing inside the opening in the third insulating film a second tungsten film thicker than the first tungsten film;

a step of removing the third insulating film;

a step of removing an exposed portion of the silicon film;

a step of forming a fourth insulating film on a sidewall of a layered film of the first and second tungsten films; and a step of introducing a second impurity into the semiconductor body to form a source and a drain both having a second conductivity type opposite to the first conductivity type.

28. A method of manufacturing a semiconductor device comprising:

a step of forming a device isolation insulating film around a first region of a semiconductor body;

a step of forming a first insulating film in the first region;

a step of forming a first metal film on the semiconductor body having the first insulating film, by a sputtering process;

a step of forming on the first metal film a third insulating film having an opening at a specified area of the first region;

a step of introducing a first impurity into the semiconductor body through the opening in the third insulating film to form a first impurity doped layer having the first conductivity type;

a step of selectively depositing inside the opening in the third insulating film a second metal film thicker than the first metal film;

a step of removing the third insulating film;

a step of removing an exposed portion of the first metal film;

a step of forming a fourth insulating film on a sidewall of a layered film of the first and second metal films; and a step of introducing a second impurity into the semiconductor body to form second and third impurity doped layers having a second conductivity type opposite to the first conductivity type.

29. A method of manufacturing a semiconductor device comprising:

a step of forming a device isolation insulating film around a first region of a semiconductor body having a first conductivity type;

a step of introducing an impurity into the first region and through the device isolation insulating film, so as to form a channel stopper region;

a step of forming a first insulating film over the surface of the first region of the semiconductor body;

a step of forming a first metal film over the first insulating film;

a step of forming a second insulating film of a desired shape over the first metal film;

a step of introducing an impurity into the semiconductor body so as to form a punch-through stopper region, the punch-through stopper region being located between the surface of the semiconductor body and the channel stopper region;

a step of selectively forming a second metal film over the first metal film exposed through the second insulating film;

a step of removing the second insulating film after selectively forming the second metal film;

a step of removing the first metal film exposed after removing the second insulting film; and a step of introducing a first impurity into the first region with the second metal film as a mask after the step of removing exposed first metal film, to form a first impurity region of a conductivity type different from that of the first region.

30. A method of manufacturing a semiconductor device comprising:

a step of forming a device isolation insulating film around a first region of a semiconductor body having a first conductivity type;

a step of introducing an impurity into the first region and through the device isolation insulating film so as to form a channel stopper region;

a step of forming a gate insulating film in the first region;

a step of forming a first tungsten film on the semiconductor body having the gate insulating film;

a step of forming on the first tungsten film a third insulating film having an opening at a specified area of the first region;

a step of introducing a first impurity into the semiconductor body through the opening in the third insulating film to form a punch-through stopper region of a first conductivity type, the punch-through stopper region being located between a surface of the semiconductor body having the first tungsten film thereon and the channel stopper region;

a step of selectively depositing inside the opening in the third insulating film a second tungsten film thicker than the first tungsten film;

a step of removing the third insulating film;

a step of removing an exposed portion of the first tungsten film;

a step of forming a fourth insulating film on a sidewall of a layered film of the first and second tungsten films; and a step of introducing a second impurity into the semiconductor body to form a source and a drain both having a second conductivity type opposite to the first conductivity type.

31. A method of manufacturing a semiconductor device comprising:

a step of forming a device isolation insulating film around a first region of a semiconductor body having a first conductivity type;

a step of introducing an impurity into the first region and through the device isolation insulating film so as to form a channel stopper region;

a step of introducing a first impurity into the semiconductor body having the device isolation insulating film to form a first impurity doped layer of a first conductivity type;

a step of forming a gate insulating film in the first region;

a step of forming a first tungsten film on the semiconductor body having the gate insulating film;

a step of forming on the first tungsten film a third insulating film having an opening at a specified area of the first region;

a step of introducing a second impurity through the opening in the third insulating film into the semiconductor body to a depth shallower than the first impurity doped layer to form a punch-through stopper region of a first conductivity type, the punch-through stopper region being located between a surface of the semiconductor body having the first tungsten film thereon and the channel stopper region;

a step of selectively depositing inside the opening in the third insulating film a second tungsten film thicker than the first tungsten film;

a step of removing the third insulating film;

a step of removing an exposed portion of the first tungsten film;

a step of forming a fourth insulating film on a sidewall of a layered film of the first and second tungsten films; and a step of introducing a second impurity into the semiconductor body to form a source and a drain both having a second conductivity type opposite to the first conductivity type.

* * * * *